United States Patent
Kudo

(10) Patent No.: US 12,402,336 B2
(45) Date of Patent: Aug. 26, 2025

(54) SEMICONDUCTOR DEVICE AND METHOD OF MANUFACTURING THE SAME

(71) Applicant: RENESAS ELECTRONICS CORPORATION, Tokyo (JP)

(72) Inventor: Shotaro Kudo, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 285 days.

(21) Appl. No.: 18/061,766

(22) Filed: Dec. 5, 2022

(65) Prior Publication Data

US 2023/0282735 A1 Sep. 7, 2023

(30) Foreign Application Priority Data

Mar. 2, 2022 (JP) .................. 2022-032023

(51) Int. Cl.
  *H10D 12/00* (2025.01)
  *H01L 21/02* (2006.01)
  (Continued)

(52) U.S. Cl.
  CPC ..... *H10D 12/441* (2025.01); *H01L 21/02236* (2013.01); *H01L 21/02271* (2013.01);
  (Continued)

(58) Field of Classification Search
  CPC .... H10D 12/441; H10D 12/038; H10D 89/60; H10D 30/0297; H10D 1/47;
  (Continued)

(56) References Cited

U.S. PATENT DOCUMENTS 7,834,407 B2    11/2010  Nakazawa et al.
2002/0185738 A1*  12/2002  Kim .................. H01L 23/5258
                                                                257/E21.582
(Continued)

FOREIGN PATENT DOCUMENTS

JP        2006-324570 A    11/2006

OTHER PUBLICATIONS

Notice of Reasons for Refusal issued in corresponding Japanese Patent Application No. 2022-032023, dated Apr. 30, 2025.

*Primary Examiner* — Shahed Ahmed
(74) *Attorney, Agent, or Firm* — Rimon P.C.

(57) ABSTRACT

A semiconductor device includes an insulating layer (IFL) on a semiconductor substrate (SUB), a conductive film (PL) on the insulating layer (IFL), an interlayer insulating film (IL) covering the conductive film (PL), a contact hole (CH1) in the interlayer insulating film (IL), the conductive film (PL) and the insulating layer (IFL), and a plug (PG1) embedded in the contact hole (CH1). A side surface of the interlayer insulating film (IL) is separated from a side surface of the conductive film (PL) to expose a part of an upper surface of the conductive film (PL), and a side surface of the insulating layer (IFL) is separated from the side surface of the conductive film (PL) to expose a part of a lower surface of the conductive film (PL). A distance (L1) from the lower surface of the conductive film (PL) to the bottom of the contact hole (CH1) is longer than a distance (L2) from the side surface of the conductive film (PL) to the side surface of the interlayer insulating film (IL).

7 Claims, 32 Drawing Sheets

(51) Int. Cl.
*H01L 21/3105* (2006.01)
*H01L 21/311* (2006.01)
*H01L 21/3205* (2006.01)
*H10D 12/01* (2025.01)
*H10D 62/13* (2025.01)
*H10D 62/17* (2025.01)
*H10D 64/01* (2025.01)
*H10D 64/23* (2025.01)
*H10D 64/66* (2025.01)
*H10D 64/68* (2025.01)
*H10D 89/60* (2025.01)

(52) U.S. Cl.
CPC .. *H01L 21/31053* (2013.01); *H01L 21/31111* (2013.01); *H01L 21/32055* (2013.01); *H10D 12/038* (2025.01); *H10D 62/133* (2025.01); *H10D 62/177* (2025.01); *H10D 64/01* (2025.01); *H10D 64/231* (2025.01); *H10D 64/664* (2025.01); *H10D 64/68* (2025.01); *H10D 89/60* (2025.01)

(58) Field of Classification Search
CPC .... H10D 1/40–476; H10D 84/403–409; H01L 21/02236; H01L 21/31053; H01L 21/32055; H01L 23/5226; H01L 23/5228; H01L 23/481; H01L 21/76802–76817; H01L 21/76877–76883
See application file for complete search history.

(56) References Cited

U.S. PATENT DOCUMENTS

| | | | |
|---|---|---|---|
| 2006/0091457 A1* | 5/2006 | Kobayashi | H10D 84/148 257/E29.136 |
| 2013/0277754 A1* | 10/2013 | Liang | H10D 84/811 257/379 |
| 2019/0259855 A1* | 8/2019 | Cheng | H10D 62/021 |
| 2019/0305078 A1* | 10/2019 | Wu | H10D 1/042 |

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2022-032023 filed on Mar. 2, 2022, including the specification, drawings and abstract is incorporated herein by reference in its entirety.

BACKGROUND OF THE INVENTION

The present invention relates to a semiconductor device and a method of manufacturing the same, and more particularly, to a semiconductor device including a contact hole formed in an interlayer insulating film and a method of manufacturing the same.

As power devices, power MOSFET (Metal Oxide Semiconductor Field Effect Transistor) and IGBT (Insulated Gate Bipolar Transistor) to which a vertical trench gate structure is applied are known. Some semiconductor devices (semiconductor chips) including a power device include a resistance region and a diode region in addition to a cell region in which a main device is formed.

For example, a semiconductor device including a power MOSFET and a protective diode is disclosed in Japanese unexamined Patent Application publication 2006-324570. The protection diode is formed on the element isolation portion and is covered with an interlayer insulating film. A contact hole is formed in the interlayer insulating film, and a gate wiring and a source electrode are embedded in the contact hole. One end of the protection diode is electrically connected to the gate wiring, and the other end of the protection diode is electrically connected to the source electrode.

SUMMARY OF THE INVENTION

Hereinafter, the semiconductor devices of Study Examples 1 to 3 studied by the inventors of the present application will be described with reference to FIGS. 27 to 32. These devices include a IGBT as a power device. FIG. 27 to FIG. 32 show regions in which resistive elements are formed, as an exemplary semiconductor element different from IGBT. Here, the conductive film PL constitutes a resistive device.

FIG. 27 shows the semiconductor device of Study Example 1. As shown in FIG. 27, in Study Example 1, a conductive film PL is formed on an upper surface of a semiconductor-substrate SUB via an insulating film IF2. The insulating film IF2 is, for example, a silicon-oxide film. The conductive film PL is, for example, a polycrystalline silicon film, and constitutes a resistive device. An interlayer insulating film IL is formed on the upper surface of the semiconductor-substrate SUB so as to cover the conductive film PL. The interlayer insulating film IL is, for example, a silicon-oxide film formed by a CVD method.

A contact hole CH1 is formed in the interlayer insulating film IL. The contact hole CH1 is formed in the same process as the contact hole reaching the body region and the emitter region of IGBT.

Here, the contact hole CH1 is formed by being etched deeper than the thickness of the interlayer insulating film IL. Therefore, a contact hole CH1 is also formed in a part of the conductive film PL. If the thickness of the conductive film PL is sufficiently thick, such as 600 nm, the bottom portion of the contact hole CH1 is located inside the conductive film FL, and the contact hole CH1 does not reach SUB of the semiconductor-substrate.

FIG. 28 shows the semiconductor device of Study Example 2. In Study Example 2, the device is more miniaturized than in Study Example 1. Therefore, as shown in FIG. 28, the planarization process is performed on the upper surface of the interlayer insulating film IL by CMP method in order to improve the processing accuracy of the contact hole. In a semiconductor device of a fine process such as SOC (System On Chip), a method of further planarizing the upper surface of the interlayer insulating film IL by placing a dummy pattern in an open space is used. On the other hand, in power devices such as IGBT, the use of such an approach is not very realistic since there is very little space to fill up the dummy pattern.

Therefore, in Study Example 2, the thickness of the conductive film PL is set to be thinner than that of Study Example 1, and is set to be, for example, 250 nm. As a result, the step difference in the upper surface of the interlayer insulating film IL is reduced.

However, since the thickness of the conductive film PL and the thickness of the interlayer insulating film IL on the conductive film PL are reduced, the bottom portion of the contact hole CH1 may penetrate through the conductive film IF2 when the contact hole CH1 is formed. Further, depending on the etch rate at the time of forming the contact hole CH1, the bottom portion of the contact hole CH1 reaches SUB of the semiconductor-substrate, and a short-circuit failure occurs.

In order to avoid such a problem, it is conceivable to individually control the depth of the contact hole CH1 by forming the contact hole CH1 in a manufacturing process different from the contact hole reaching the body region and the emitter region of IGBT. However, in this case, since an increase in the number of masks and an addition of a manufacturing process are performed, the manufacturing cost is increased.

FIG. 29 to FIG. 32 show the semiconductor device of Study Example 3. In Study Example 3, as shown in FIG. 29, an insulating film IF1 is formed below the insulating film IF2. The insulating film IF1 is, for example, a silicon-oxide film formed by a thermal oxidation method. By providing the insulating layer IFL, which is a laminated film of the insulating film IF1 and the insulating film IF2, below the conductive film PL, even if the contact hole CH1 penetrates through the insulating film IF2, it is possible to prevent the bottom of the contact hole CH1 from reaching SUB of the semiconductor-substrate.

In recent processes, in order to increase the contact area between the plug and the emitter area embedded in the contact hole of IGBT and the contact area between the plug PG1 and the conductive film PL, an isotropic etch process is performed on the interlayer insulating film IL. In this isotropic etching process, a solution containing hydrofluoric acid is used, and the silicon oxide film is selectively etched.

FIG. 30 shows the state after the isotropic etching treatment. By the isotropic etching process, the side surface of the interlayer insulating film IL is retracted, and the upper surface of the conductive film PL is exposed. At the same time, a part of the insulating film IF2 and the insulating film IF1 made of the silicon oxide film is also retreated, and the lower surface of the conductive film PL is exposed.

Thereafter, as shown in FIG. 31, a barrier metal film BM is formed in the contact hole CH1, and as shown in FIG. 32, a conductive film CF is formed on the barrier metal film BM so as to fill the inside of the contact hole CH1. The barrier metal film BM and the conductive film CF form a plugging PG1. The barrier metal film BM is formed by a CVD method, and is formed of, for example, a laminated film of a titanium film and titanium nitride. The conductive film CF is formed by a CVD method and is made of, for example, a tungsten film.

By the isotropic etching process described above, the distance from the side surface of the conductive film PL to the side surface of the interlayer insulating film IL in the contact hole CH1 becomes the distance L2. The distance from the lower surface of the conductive film PL to the bottom portion of the contact hole CH1 is a distance L3. The etching rate of the insulating film IF1 formed by the thermal oxidation method is slightly lower than the etching rate of the insulating film IF2 and the interlayer insulating film IL formed by CVD method. Therefore, the distance L3 is equal to or shorter than the distance L2.

As shown in FIG. 31, when the distance L3 is short, a portion where the thickness of the barrier metal film BM is not sufficient is likely to be generated because the gases used in CVD method when the barrier metal film BM is formed are not sufficiently supplied to the vicinity of the lower surface of the conductive film PL.

The barrier metal film BM also serves as a seeding film when the conductive film CF is formed. Therefore, as shown in FIG. 32, at a portion where the barrier metal film BM is thin, the conductive film CF is less likely to grow sufficiently, and a gap is likely to be generated in the contact hole CH1. In addition, in a portion where the barrier metal film BM is not formed, WF 6 gases react with the conductive film CF (polycrystalline silicon film), and a defect occurs in that a part of the conductive film CF is absent. Such locations are shown as defective locations 20 in FIG. 32 and are susceptible to corrosion or deformation in later manufacturing steps.

In order to increase the distance L3, it is conceivable to increase the duration of the isotropic etch process, but this also increases the distance L2 and widens the opening width of the contact hole CH1. Therefore, the opening width of the contact hole of IGBT becomes too wide, so that the gate-electrode of IGBT is exposed in the contact hole of IGBT. Therefore, there is a problem that the gate electrode of IGBT is electrically connected to the emitter electrode.

The main purpose of the present application is to suppress the above-described defects and to improve the reliability of a semiconductor device. Other objects and novel features will become apparent from the description of this specification and the accompanying drawings.

MEANS OF SOLVING THE PROBLEMS

The typical ones of the embodiments disclosed in the present application will be briefly described as follows.

A semiconductor device according to an embodiment includes:
- a semiconductor substrate having an upper surface and a lower surface;
- an insulating layer formed from the upper surface of the semiconductor substrate to an inside of the semiconductor substrate;
- a first conductive film formed on the insulating layer,
- an interlayer insulating film formed on the upper surface of the semiconductor substrate to cover the first conductive film;
- a first contact hole formed in the interlayer insulating film, the first conductive film and the insulating layer so that a bottom portion of the first contact hole is positioned in the insulating layer; and
- a first plug formed to fill up the first contact hole,
wherein a side surface of the interlayer insulating film is separated from a side surface of the first conductive film so that a part of an upper surface of the first conductive film is exposed from the interlayer insulating film in the first contact hole,
wherein a side surface of the insulating layer is separated from a side surface of the first conductive film so that a part of a lower surface of the first conductive film is exposed from the insulating layer in the first contact hole, and
wherein a first distance from the part of the lower surface of the first conductive film to the bottom portion of the first contact hole is longer than a second distance from the side surface of the first conductive film to the side surface of the interlayer insulating film.

A method of manufacturing a semiconductor device according to an embodiment includes:
(a) preparing a semiconductor substrate having an upper surface and a lower surface.
(b) after the step (a), forming a first insulating film extending from an upper surface of the semiconductor substrate to an inside of the semiconductor substrate;
(c) after the step (b), forming a second insulating film having a thickness thinner than the first insulating film on the first insulating film;
(d) after the step (c), forming a first conductive film on the second insulating film;
(e) after the step (d), forming an interlayer insulating film on the upper surface of the semiconductor substrate so as to cover the first conductive film;
(f) after the step (e), forming a first contact hole in the interlayer insulating film, the first conductive film, the second insulating film and the first insulating film so that a bottom portion of the first contact hole is located in the first insulating film,
(g) after the step (f), subjecting the interlayer insulating film, the second insulating film and the first insulating film to an isotropic etching treatment, and
(h) after the step (g), embedding a first plug in the first contact hole,
wherein a side surface of the interlayer insulating film is separated from a side surface of the first conductive film so that a part of an upper surface of the first conductive film is exposed from the interlayer insulating film in the first contact hole by the isotropic etching treatment in the step (g),
wherein a side surface of the first insulating film and a side surface of the second insulating film in the first contact hole are separated from the side surface of the first conductive film so that a part of a lower surface of the first conductive film is exposed from the first and second insulating films by the isotropic etching treatment in the step (g), and
wherein a first distance from the lower surface of the first conductive film to the bottom portion of the first contact hole is longer than a second distance from the side surface of the first conductive film to the side surface of the interlayer insulating film.

A method of manufacturing a semiconductor device according to an embodiment is a method of manufacturing a semiconductor device having a first region and a second region different from the first region. A manufacturing method of this semiconductor device, comprising the steps of:

(a) a step of preparing a semiconductor substrate having an upper surface and a lower surface, (b) a step of forming a first insulating film from a position higher than an upper surface of the semiconductor substrate to an inside of the semiconductor substrate in the first region after the step (a), (c) a step of forming a trench on an upper surface side of the semiconductor substrate in the second region after the step (b), (d) a step of subjecting the first insulating film to an isotropic etching treatment so that a thickness of the first insulating film becomes thin after the step (c), (e) a step of forming a gate insulating film in the trench after the step (d), (f) a step of forming a gate electrode on the gate insulating film to fill the trench after the step (e), (g) a step of forming a second insulating film covering the first insulating film in the first region and covering the gate electrode in the second region after the step (f), the second insulating film having a thickness smaller than that of the first insulating film after the step (f);

(h) a step of forming a second conductive film on the second insulating film in the first region and the second region after the step (g);

(i) a step of removing the first conductive film and the second insulating film so that the first conductive film and the second insulating film are selectively left on the first insulating film after the step (h);

(j) a step of forming a first impurity region of a first conductivity type on the upper surface side of the semiconductor substrate so that a bottom portion thereof is positioned above a bottom portion of the trench after the step (i), (k) a step of forming a second impurity region of a second conductivity type opposite to the first conductivity type in the first impurity region after the step (j), (l) a step of forming an interlayer insulating film on the upper surface of the semiconductor substrate in the first region and the second region to cover the first conductive film in the first region and to cover the gate electrode, the first impurity region and the second impurity region in the second region after the step (k), (m) a step of performing a planarization process to the interlayer insulating film in the first region and the second region by a CMP method after the step (l);

(n) a step of forming a first contact hole in the interlayer insulating film, the first conductive film, the second insulating film and the first insulating film in the first region so that a bottom portion thereof is located in the first insulating film, and forming a second contact hole in the interlayer insulating film, the second impurity region and the first impurity region in the second region so that a bottom portion thereof is located in the first impurity region, after the step (m);

(o) a step of burying a first plug in the first contact hole and burying a second plug in the second contact hole after the step (n).

According to one embodiment, the reliability of the semiconductor device can be improved.

DETAILED DESCRIPTION

Figure 1:
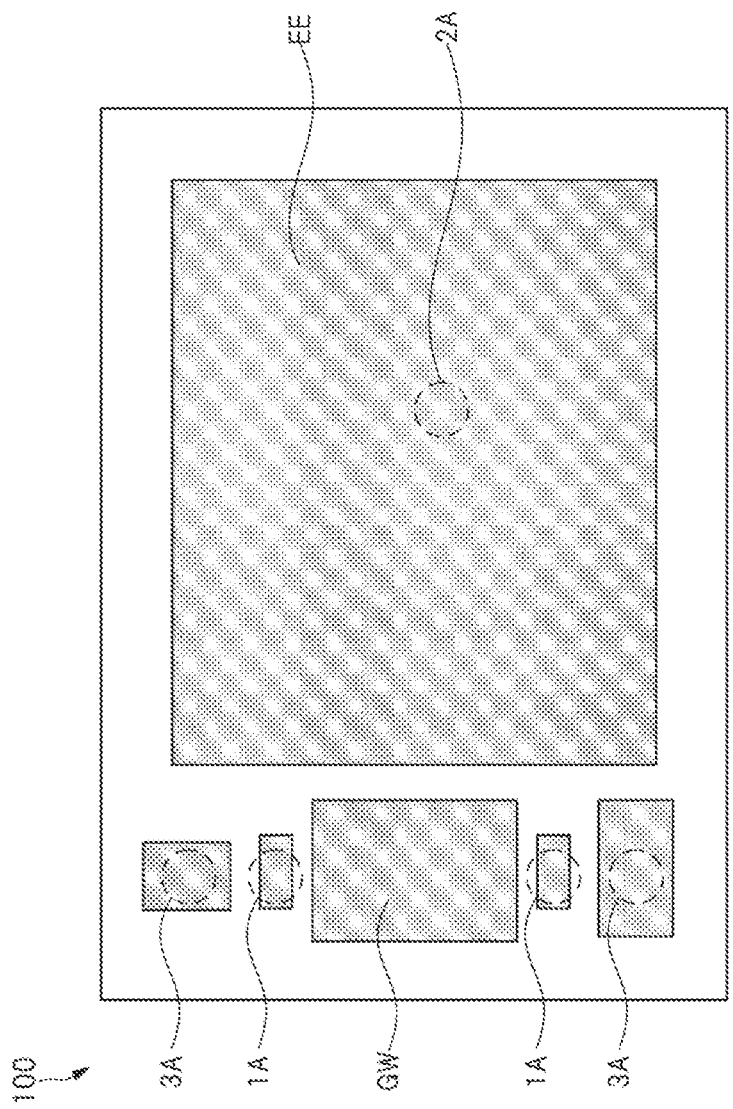
FIG. 1 is a plan view showing the entire semiconductor device of the first embodiment.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

A semiconductor device 100 according to Embodiment 1 will be described below with reference to FIG. 1 to FIG. 8. FIG. 1 is a plan view illustrating a semiconductor chip that is a semiconductor device 100.

As shown in FIG. 1, most of the device 100 is covered with an emitter electrode EE, and a plurality of cells constituting a IGBT are formed under the emitter electrode EE. A gate-line GW is formed around the emitter-electrode EE. A central portion of the emitter-electrode EE serves as an emitter pad, and a central portion of the gate wire serves as a gate pad. External connection terminals such as wire bonding or clips (copper plates) are connected to the emitter pad and the gate pad, so that the semiconductor device 100 is electrically connected to another semiconductor chip, a wiring board, or the like.

The device 100 includes regions 1A~3A that are regions that differ from each other. The region 1A in FIG. 1 is a resistance element region in which a resistance element is formed. The resistive element is used for a gate resistor or the like. The region 2A in FIG. 1 is a cell region in which a plurality of cells constituting a IGBT are formed. The region 3A in FIG. 1 is a diode element region in which a diode element is formed. Diode elements are used for gate protection or temperature sensing, etc.

Figure 2:
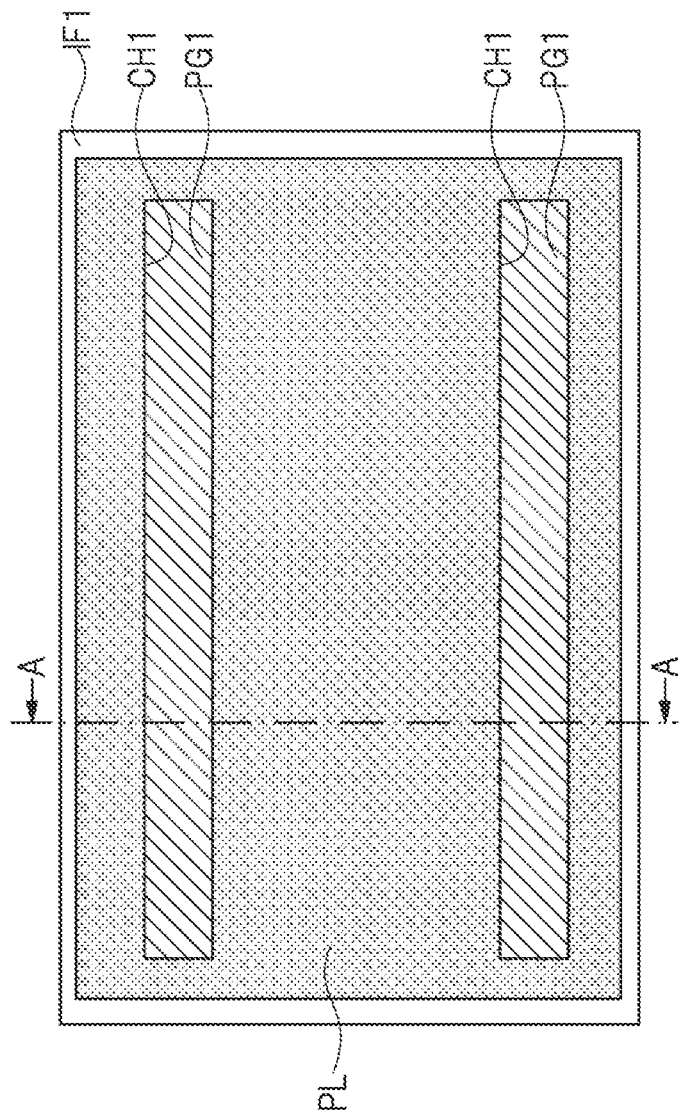
FIG. 2 is a plan view showing a semiconductor device according to the first embodiment.
Figure 3:
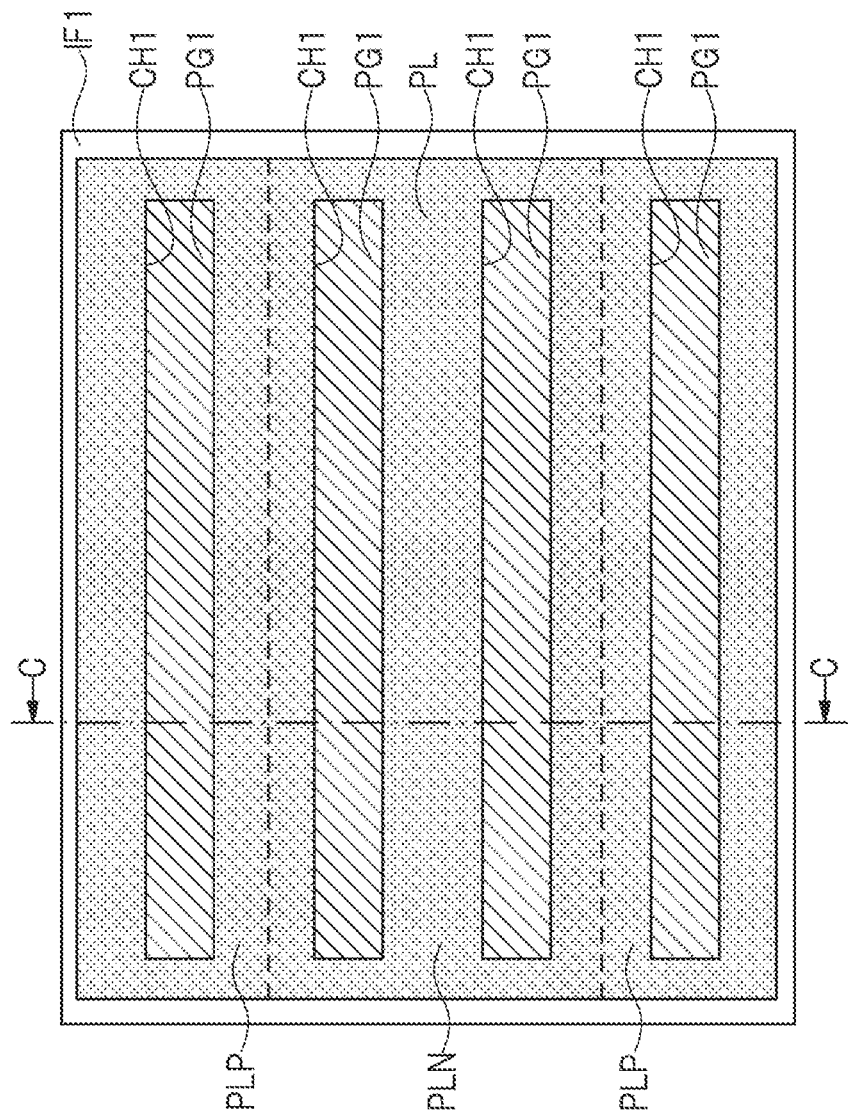
FIG. 3 is a plan view showing a semiconductor device according to the first embodiment.
Figure 4:
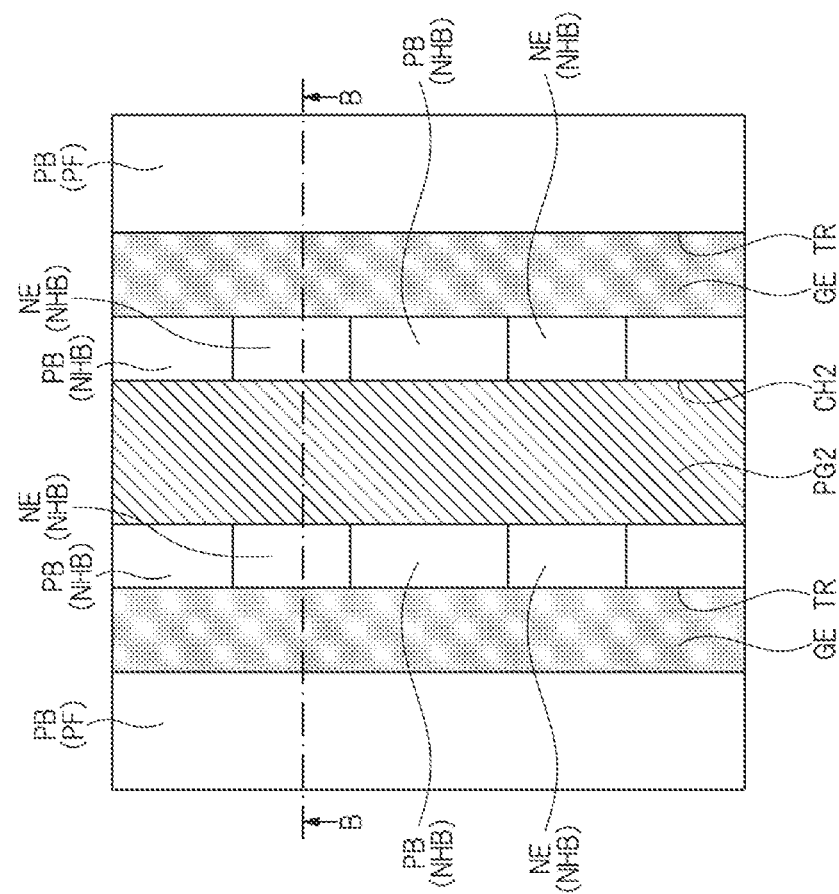
FIG. 4 is a plan view showing a semiconductor device according to the first embodiment.
Figure 5:
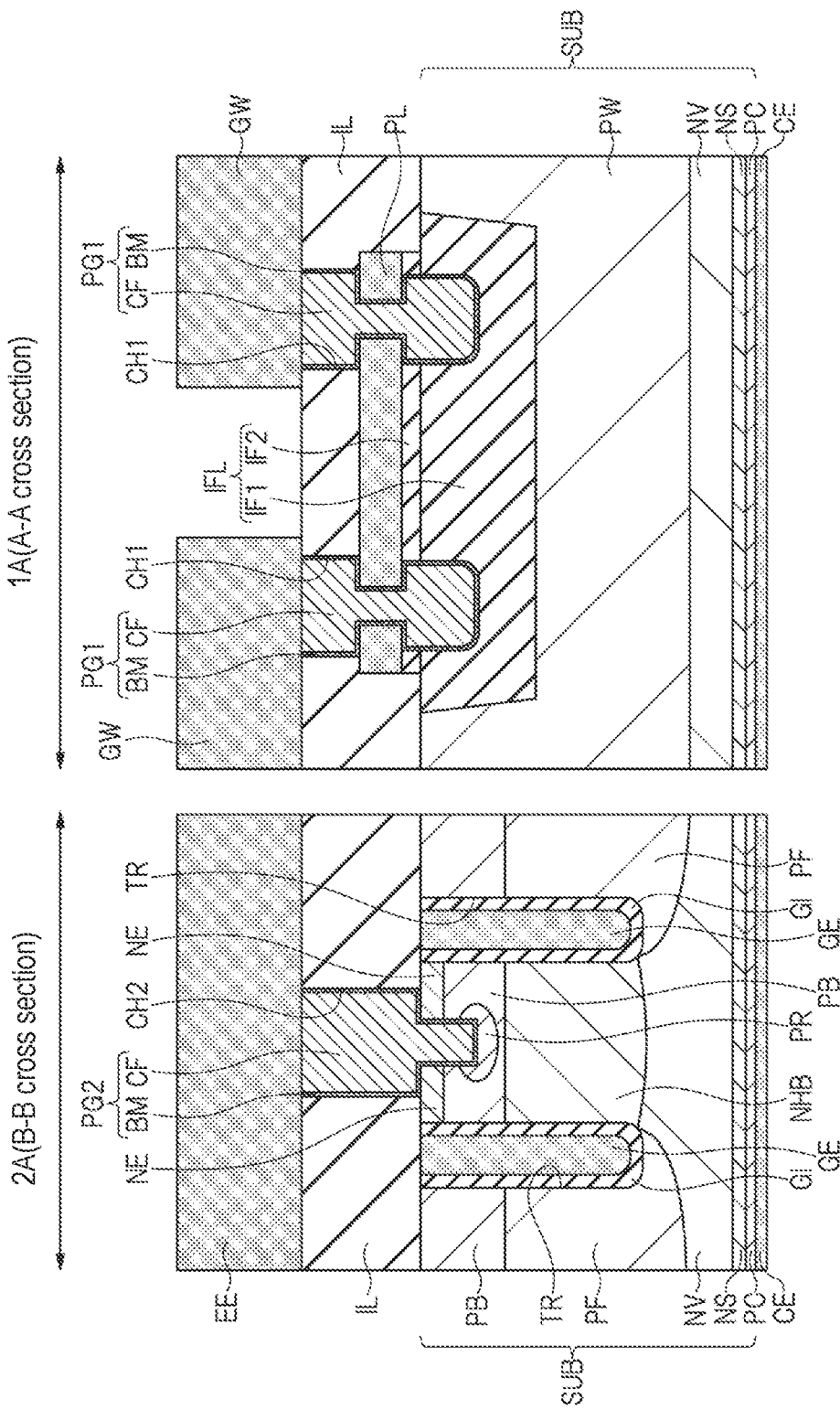
FIG. 5 is a sectional view showing a semiconductor device according to the first embodiment.
Figure 6:
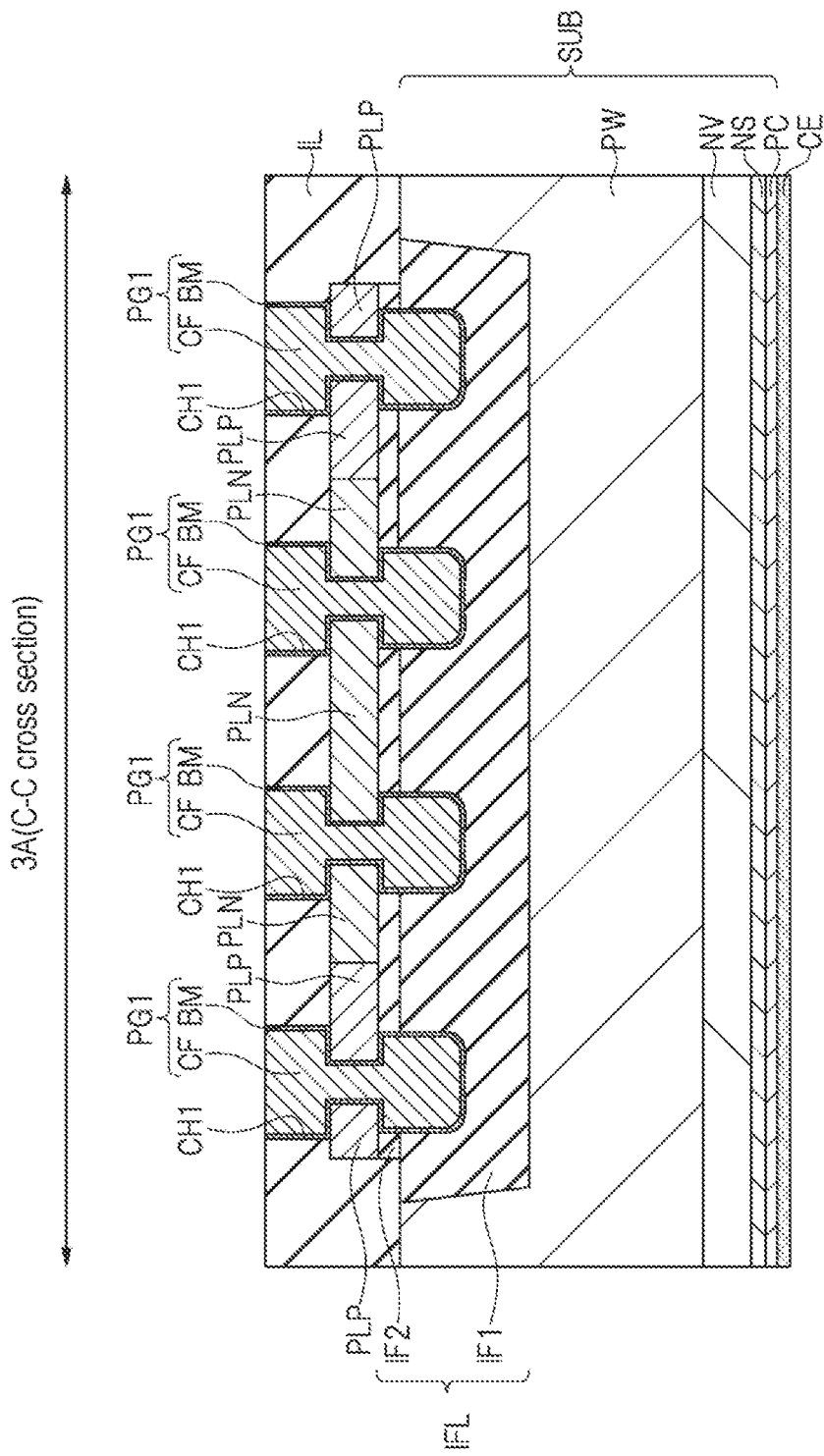
FIG. 6 is a sectional view showing a semiconductor device according to the first embodiment.

FIG. 2 is a plan view of a main part corresponding to the region 1A. FIG. 3 is a plan view of a main part corresponding to the region 3A. FIG. 4 is a plan view of a main part corresponding to the region 2A. FIG. 5 is a cross-sectional view taken along A-A line of FIG. 2 and a cross-sectional view taken along B-B line of FIG. 4; FIG. 6 is a cross-sectional view taken along C C line of FIG. 3.

As shown in FIGS. 2 to 4, the contact hole CH1, CH2 has a slit-shape in which an opening width in a first direction is wider than an opening width in a second direction perpendicular to the first direction in a plan view. That is, the contact hole CH1, CH2 has a rectangular shape in plan view.

However, the planar shape of the contact hole CH1, CH2 is not limited to the slit shape, and may be a dot shape in which the opening width in the first direction is the same as the opening width in the second direction. That is, a plurality of contact holes CH1, CH2 having a rectangular shape in a plan view may be arranged in the first direction.

In many cases, the planar shape of the contact hole CH1, CH2 is a shape in which the corners are rounded after resolution of photolithography. Therefore, finally, the contact hole CH1, CH2 has a shape in which the corners of the rectangle are rounded or a circular shape in a plan view.

The main features of the diode element shown in FIGS. 3 and 6 are substantially the same as the main features of the resistor element shown in FIGS. 2 and 5, except that a p-type anode region PLP and an n-type cathode region PLN are formed on the conductive film PL. Therefore, the resistive elements in the region LA and the cells in IGBT of the region 2A will be described below.

As illustrated in FIGS. 5 and 6, the semiconductor device 100 includes a semiconductor board SUB having a low-concentration n-type drift-region NV. Here, the n-type semiconductor-substrate SUB itself constitute the drift-region NV. Note that the drift-region NV may be a stack of an n-type silicon substrate and semiconductor layers grown by introducing phosphorus (P) onto the silicon substrate by an epitaxial growth method. In the present application, such a stack is also described as being a semiconductor-substrate SUB.

On the lower surface of the semiconductor substrate SUB, an n-type field stop region (impurity region) NS is formed on the semiconductor substrate SUB. The field stop region NS is provided to prevent the depletion layer extending from pn junction on the upper surface of SUB from reaching the p-type collector region PC when IGBT is turned off.

On the lower surface of the semiconductor substrate SUB, a p-type collector region (impurity region) PC is formed on the semiconductor substrate SUB. The collector region PC is located below the field stop region NS.

A collector-electrode CE is formed under the lower surface of the semiconductor-substrate SUB. The collector electrode CE is electrically connected to the collector region PC and supplies a collector potential to the collector region PC. The collector electrode CE consists of metallic films such as AlSi films, Ti films, NiV films and Au films.

The configuration of the region LA will be described below. In the device 100, a conductive film PL formed on the region 1A is used as a resistive element.

As shown in FIG. 5, a p-type well area PW is formed in the semiconductor substrate SUB on the upper surface of the semiconductor substrate SUB. The well region PW is formed in the same process as the floating region PF of the region 1A, but is physically separated from the floating region PF.

Insulating layers IFL are formed from the upper surface of the semiconductor substrate SUB to the inside of the semiconductor substrate SUB. In other words, in the semiconductor substrate SUB, the insulating layer IFL is formed, and the lower surface of the insulating layer IFL is located below the upper surface of the semiconductor substrate SUB.

The insulating layers IFL include an insulating film IF1 and an insulating film IF2. The insulating film IF1 is formed inside the semiconductor-substrate SUB and is, for example, a silicon-oxide film. The insulating film IF2 is formed on the insulating film IF1, and is, for example, a silicon-oxide film. The insulating film IF2 has a thickness smaller than that of the insulating film IF1. The thickness of the insulating film IF1 is, for example, 500~600 nm. The thickness of the insulating film IF2 is, for example, 50~100 nm.

A conductive film PL is formed on the insulating layers IFL. The conductive film PL is, for example, a p-type doped polysilicon film. The thickness of the conductive film PL is, for example, 150~250 nm.

An interlayer insulating film IL is formed on the upper surface of the semiconductor-substrate SUB so as to cover the conductive film PL. The interlayer insulating film IL is, for example, a silicon-oxide film. Further, the interlayer insulating film IL is subjected to a planarization treatment for planarizing the upper surface of the interlayer insulating film IL. Therefore, the thickness of the interlayer insulating film IL on the upper surface of the semiconductor-substrate SUB is, for example, 600~800 nm, but the thickness of the interlayer insulating film IL on the upper surface of the conductive film PL is, for example, 300~450 nm.

Contact holes CH1 are formed in the interlayer insulating film IL, the conductive film PL, and the insulating layer IFL. The bottom of the contact hole CH1 is located in the insulating layers IFL (in the insulating film IF1). A plug-in PG1 is embedded in the contact hole CH1. The plug PG1 includes a barrier metal film BM and a conductive film CF formed on the barrier metal film BM. The barrier metal film BM is, for example, a laminated film of a titanium film and a titanium nitride film formed on the titanium film. The conductive film CF is, for example, a tungsten film.

A gate wire GW is formed on the interlayer insulating film IL. The conductive film PL is electrically connected to the gate-line GW via a plug PG1. The conductive film PL can be used as a gate resistor by forming an electric path in the middle of the gate wire GW by the conductive film PL.

A main feature of the first embodiment is the shape of the contact hole CH1 and the point where the plug PG1 and the conductive film PL are in contact with each other in the contact hole CH1.

<Structure of IGBT cell> The structure of the region 2A is described below. Here, a IGBT in which a vertical trench gate structure is applied will be exemplified.

As shown in FIG. 5, a trench TR is formed in the semiconductor substrate SUB on the upper surface of the semiconductor substrate SUB. The depth of the trench TR is, for example, 3 to 4 micrometers. A gate insulating film GI is formed in the trench TR. The gate electrode GE is formed on the gate insulating film GI so as to fill the trench TR. The gate insulating film GI is, for example, a silicon oxide film, and the gate electrode GE is, for example, a polycrystalline silicon film into which an n-type impurity is introduced.

On the upper surface of the semiconductor substrate SUB, a hole barrier region (impurity region) NHB is formed in the semiconductor substrate SUB between the pair of gate-electrode GE. A p-type base region (impurity region) PB is formed in the hole barrier region NHB. An n-type emitter region (impurity region) NE is formed in the p-type base region PB. The bottom of the base region PB is located above the bottom of the trench TR, and the bottom of the emitter region NE is located above the bottom of the base region PB.

Further, on the upper surface of the semiconductor substrate SUB, a p-type floating region (impurity region) PF is formed on the semiconductor substrate SUB other than the region where the hole barrier region NHB is formed. A p-type base region PB is formed in the floating region PF. The floating area PF is formed to a position deeper than the bottom of the trench TR in order to enhance the high breakdown voltage property, and is formed so as to cover the bottom of the trench TR.

The interlayer insulating film IL is also formed on the upper surface of the semiconductor-substrate SUB in the region 2A so as to cover the gate-electrode GE, the emitter region NE, and the base region PB. Contact holes CH2 are formed in the interlayer insulating film IL, the emitter region NE, and the base region PB in the region 2A. The bottom of the contact hole CH2 is located in the base-region PB. A plug-in PG2 is embedded in the contact hole CH2. The plug PG2 is configured similarly to the plug PG1 and includes a barrier metal film BM and a conductive film CF.

A p-type high-concentration diffused region (impurity region) PR is formed in the base region PB around the bottom portion of the contact hole CH2. The high-concentration diffused area PR is provided to reduce the contact-resistance with the plug PG2 and to prevent latch-up.

In the region 2A, since an isotropic etch process is performed on the interlayer insulating film IL in order to increase the contact area between the plug PG2 embedded in the contact hole CH2 and the emitter region NE, the side surface of the interlayer insulating film IL is retracted. That is, in the contact hole CH2, the side surface of the interlayer insulating film IL is separated from the side surface of the emitter region NE so that a part of the upper surface of the emitter region NE is exposed.

An emitter-electrode EE is formed on the interlayer insulating film IL. The emitter electrode EE is electrically connected to the emitter region NE, the base region PB, and the highly diffused region PR via the plug PG2, and supplies an emitter potential to these regions. Although not illustrated here, the gate interconnect GW is electrically connected to the gate electrode GE via other plug, and supplies a gate potential to the gate electrode GE.

The emitter-electrode EE and the gate-line GW are formed of, for example, a TiW film and an aluminium film formed on TiW film. The aluminum film is a main conductive film of the emitter-electrode EE and the gate-line GW, and is sufficiently thicker than TiW film.

As shown in FIG. 6, the structure of the region 3A will be described below. In the device 100, a conductive film PL formed on the region 3A is used as a diode-element. Since the rest of the structure is the same as the region 1A, the explanation thereof will be omitted.

In the diode device shown in FIG. 6, the p-type anode region PLP and the n-type cathode region PLN are formed by ion-implantation on the conductive film PL. Contact holes CH1 are formed in the anode region PLP and the cathode region PLN, respectively, and a plug PG1 is embedded in the contact hole CH1. Although not illustrated here, the emitter-electrode EE and the gate-line GW are formed on the interlayer insulating film IL in the region 3A. The anode region PLP is electrically connected to the emitter electrode EE via the plug PG1, and the cathode region PLN is electrically connected to the gate wire GW via the plug PG1.

Figure 7:
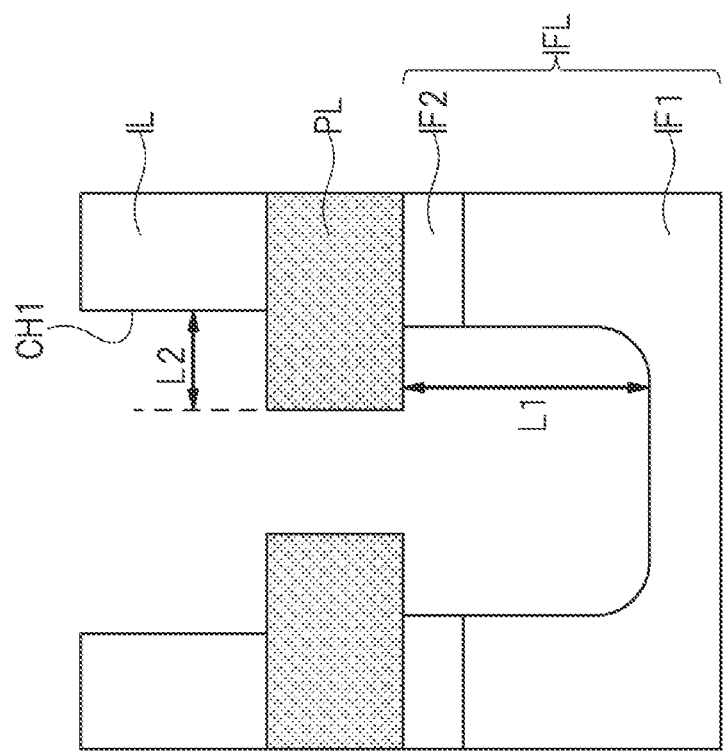
FIG. 7 is an enlarged cross-sectional view of a part of a semiconductor device according to a first embodiment.
Figure 8:
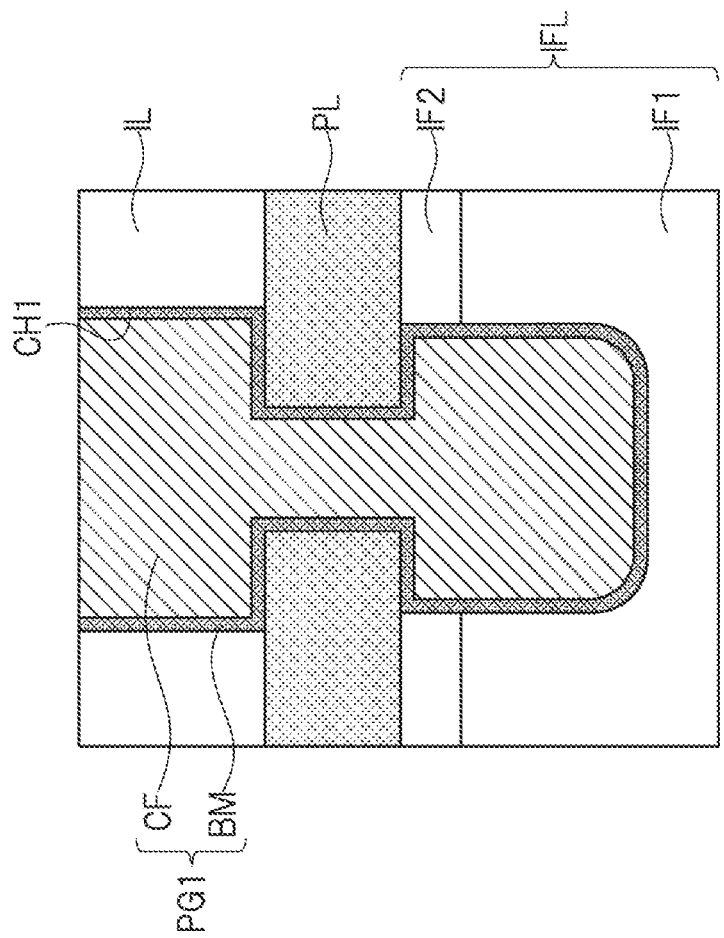
FIG. 8 is an enlarged cross-sectional view of a part of a semiconductor device according to the first embodiment.

<Main features of the first embodiment> The main features of the first embodiment will be described with reference to FIGS. 7 and 8 below. FIG. 7 and FIG. 8 are enlarged cross-sectional views of the periphery of the contact hole CH1. FIG. 7 shows a state in which the plug PG1 is not embedded in the contact hole CH1.

In the region 1A, since the isotropic etch process is performed on the interlayer insulating film IL in the same step as the step of forming the contact hole CH2 in the area 2A, the side surface of the interlayer insulating film IL is retreated.

In the contact hole CH1, the side surface of the interlayer insulating film IL is separated from the side surface of the conductive film PL so that a part of the upper surface of the conductive film PL is exposed. The distance L2 between these sides is, for example, 50~100 nm.

Here, the insulating layers IFL are also retreated by the isotropic etching process described above. Therefore, in the contact hole CH1, the side surface (the side surface of the insulating film IF1 and the side surface of the insulating film IF2) of the insulating layer IFL is separated from the side surface of the conductive film PL so that a part of the lower surface of the conductive film PL is exposed. In other words, the opening width of the contact hole CH1 formed in the interlayer insulating film IL and the opening width of the contact hole CH1 formed in the insulating layer IFL are wider than the opening width of the contact hole CH1 formed in the conductive film PL.

As will be described later, in the first embodiment, the contact hole CH1 is formed in advance so that the bottom of the contact hole CH1 reaches the inside of the insulating layers IFL prior to the isotropic etch process described above. Since the above-described isotropic etch process is performed in this condition, the distance L1 from the lower surface of the conductive film PL to the bottom portion of the contact hole CH1 is longer than the distance L3 of the third study example, and is longer than the distance L2. The distance L1 is, for example, a 150~200 nm.

In Study Example 3, since the distance L3 is short, a portion where the thickness of the barrier metal film BM is insufficient is likely to be generated. Therefore, in a portion where the barrier metal film BM is thin, it is difficult for the conductive film CF to grow sufficiently, and a gap is easily generated in the contact hole CH1, and there is a problem that $WF_6$ gases react with the conductive film CF and a part of the conductive film CF is lacking.

In the first embodiment, since the distance L1 is sufficiently long, the gases used in CVD method when forming the barrier metal film BM are sufficiently supplied to the vicinity of the lower surface of the conductive film PL. Therefore, a sufficiently thick barrier metal film BM is ensured in the contact hole CH1. Since the barrier metal film BM also serves as a seeding film when forming the conductive film CF, the conductive film CF is also sufficiently grown. Therefore, in the first embodiment, various problems that have occurred in the examination example 3 are solved, so that the reliability of the semiconductor device can be improved.

The barrier metal film BM is in contact with a part of the upper surface of the conductive film PL, a side surface of the conductive film PL, and a part of the lower surface of the conductive film PL in the contact hole CH1. Therefore, since the contact area between the plug PG1 and the conductive film PL can be increased, the contact resistivity between the plug PG1 and the conductive film PL can be reduced, and the adhesion between the plug PG1 and the conductive film PL can be improved.

Note that the same advantages as those of the resistive element of the region LA can be obtained also in the diode element of the region 3A.

A method of manufacturing the semiconductor device 100 according to the first embodiment will be described below with reference to FIGS. 9 to 26.

Figure 9:
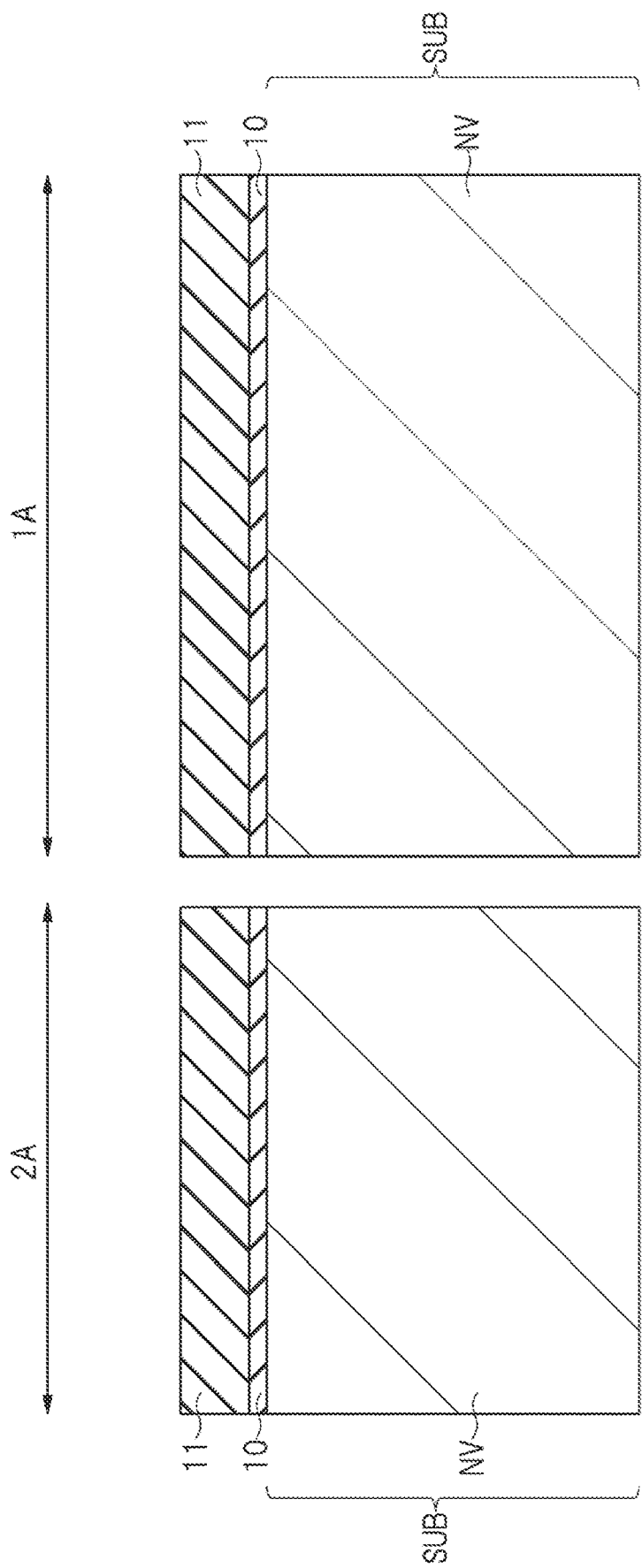
FIG. 9 is a cross-sectional view showing a manufacturing process of a semiconductor device according to the first embodiment.

First, as shown in FIG. 9, a semiconductor-substrate SUB having an n-type drift-region NV is prepared. The semiconductor-substrate SUB has an upper surface and a lower surface. Next, the silicon oxide film 10 is formed on the upper surface of the semiconductor-substrate SUB by, for example, thermal oxidation. Next, a silicon nitride film 11 is formed on the silicon oxide film 10 by, for example, a CVD method.

Figure 10:
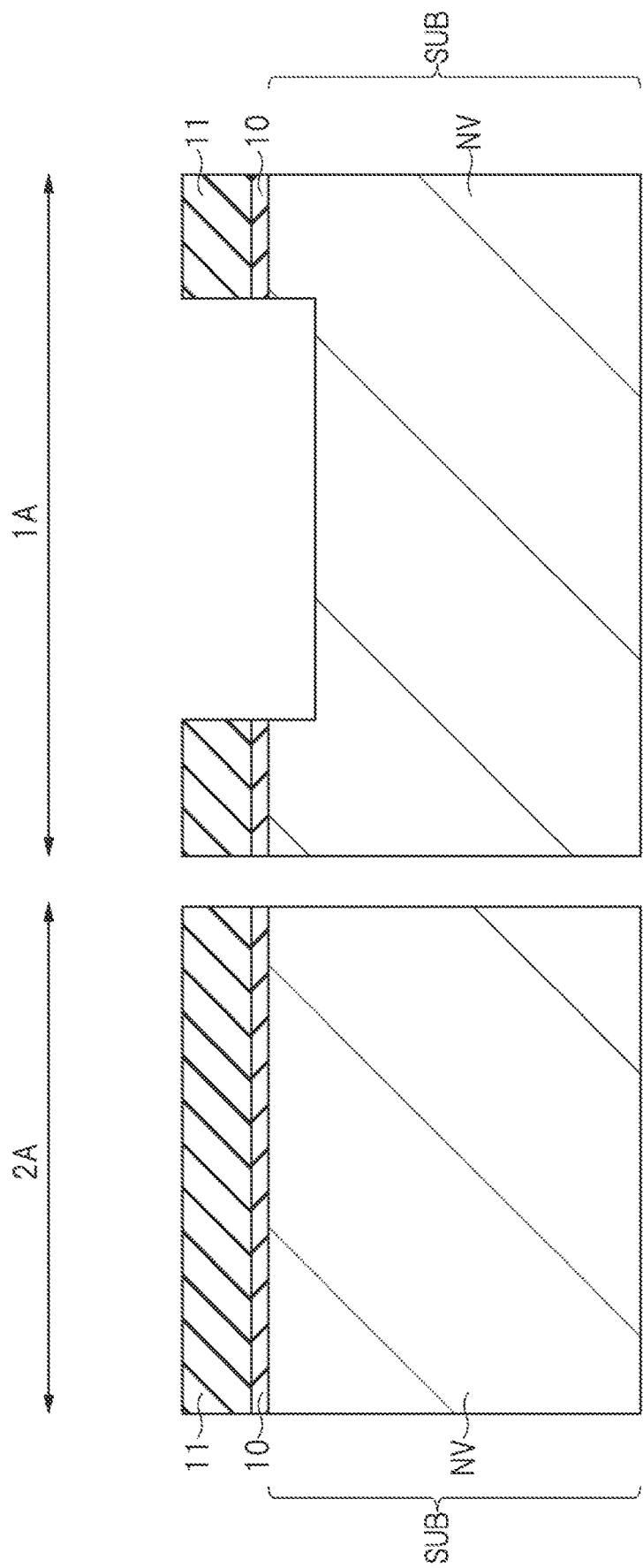
FIG. 10 is a cross-sectional view illustrating a manufacturing process following FIG. 9.

Next, as shown in FIG. 10, the silicon nitride film 11 and the silicon oxide film 10 in the region 1A are selectively removed by a photolithography technique and a dry etching process, and openings are formed in the silicon nitride film 11 and the silicon oxide film 10. Then, a portion of the semiconductor substrate SUB exposed at the opening is etched to form a trench in the semiconductor substrate SUB.

Figure 11:
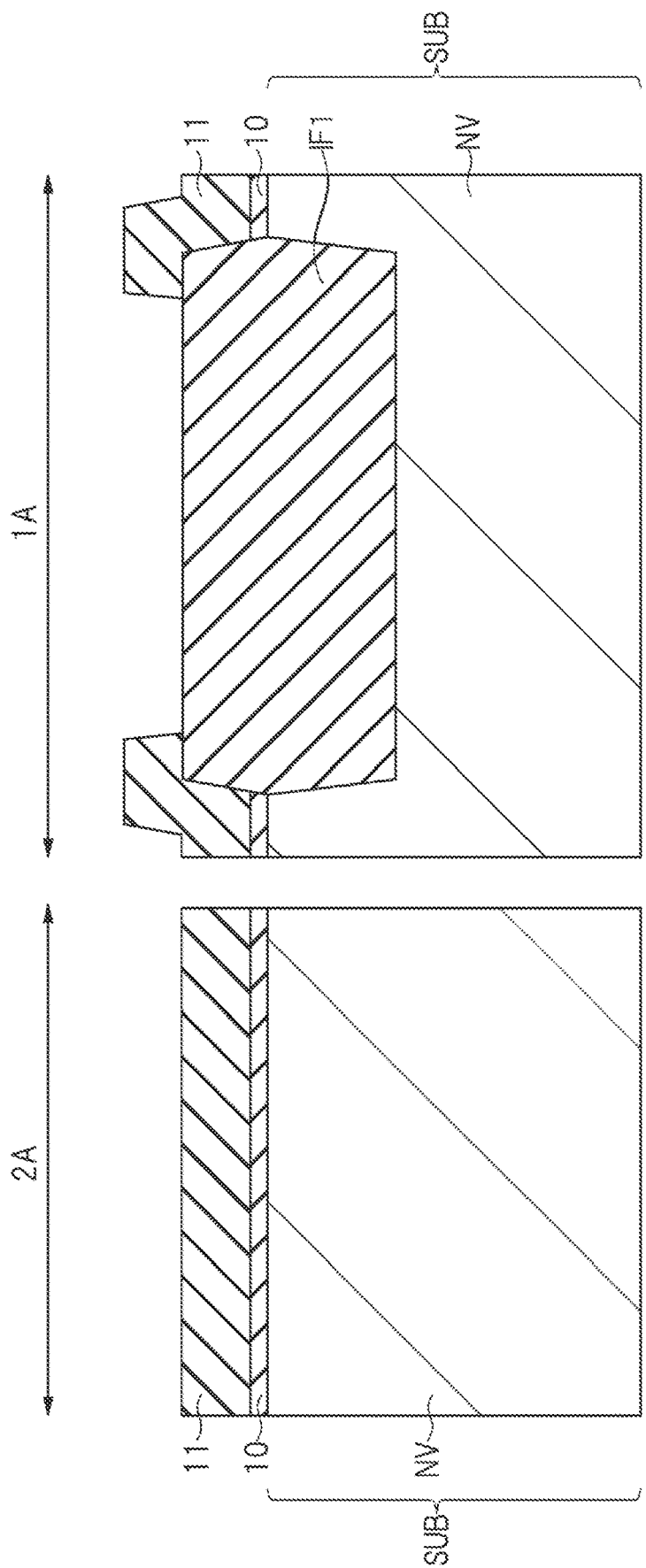
FIG. 11 is a cross-sectional view illustrating a manufacturing step following FIG. 10.

Next, as shown in FIG. 11, the semiconductor substrate SUB is thermally oxidized to form an insulating film IF1 from the upper surface of the semiconductor substrate SUB to the inside of the semiconductor substrate SUB. In this state, the insulating film IF1 is formed to a position higher than the upper surface of the semiconductor-substrate SUB. That is, a LOCOS insulating film IF1 is formed on SUB of the region 1A. In this condition, the thickness of the insulating film IF1 is, for example, 700~800 nm.

Figure 12:
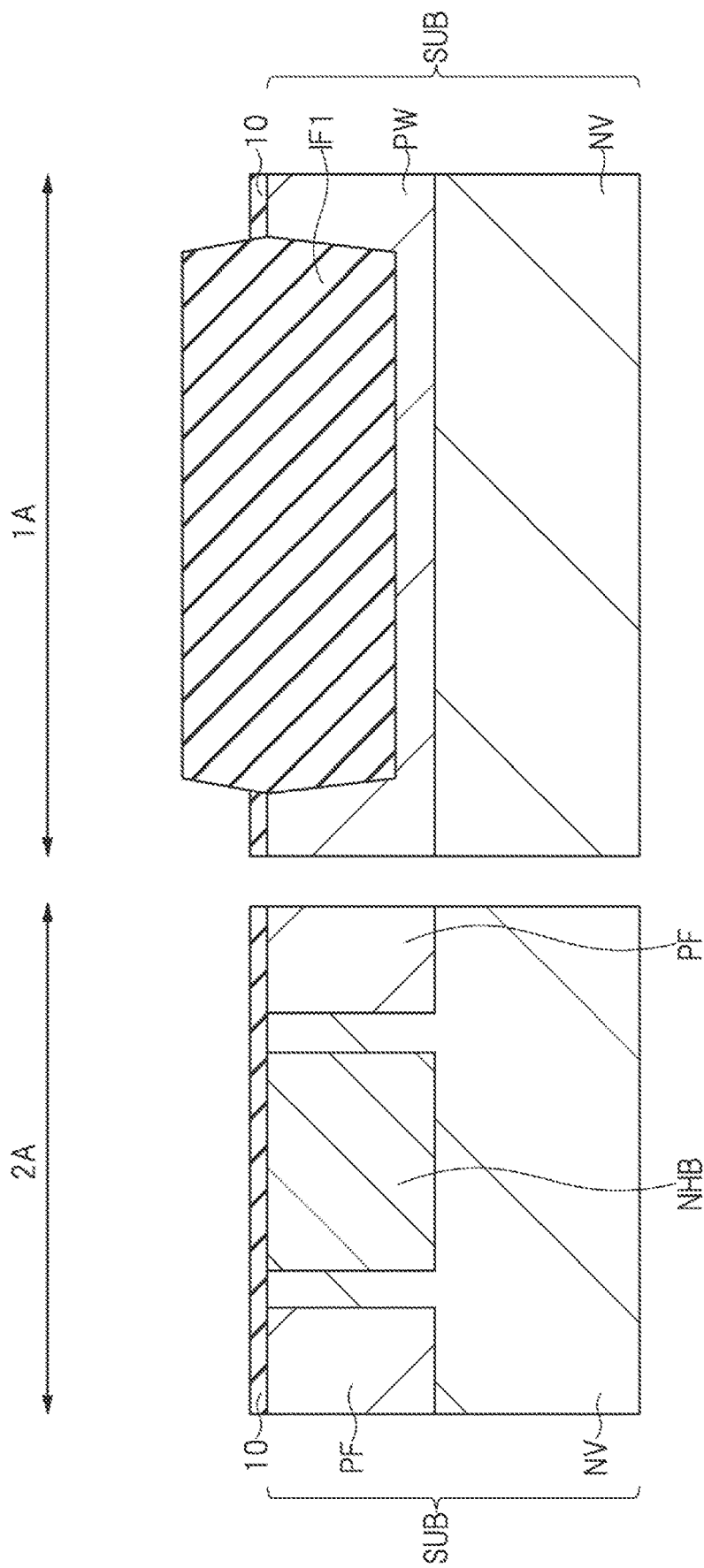
FIG. 12 is a cross-sectional view illustrating a manufacturing step following FIG. 11.

Next, as shown in FIG. 12, the silicon nitride film 11 is removed by an isotropic etching process using a solution containing phosphoric acid. Next, a p-type well region PW is formed on the semiconductor substrate SUB of the region LA by photolithography and ion implantation, and a p-type floating region PF is formed on the semiconductor substrate SUB of the region 2A. Next, an n-type hole-barrier region NHB is formed on SUB of the region 2A by photolithography and ion-implantation.

Figure 13:
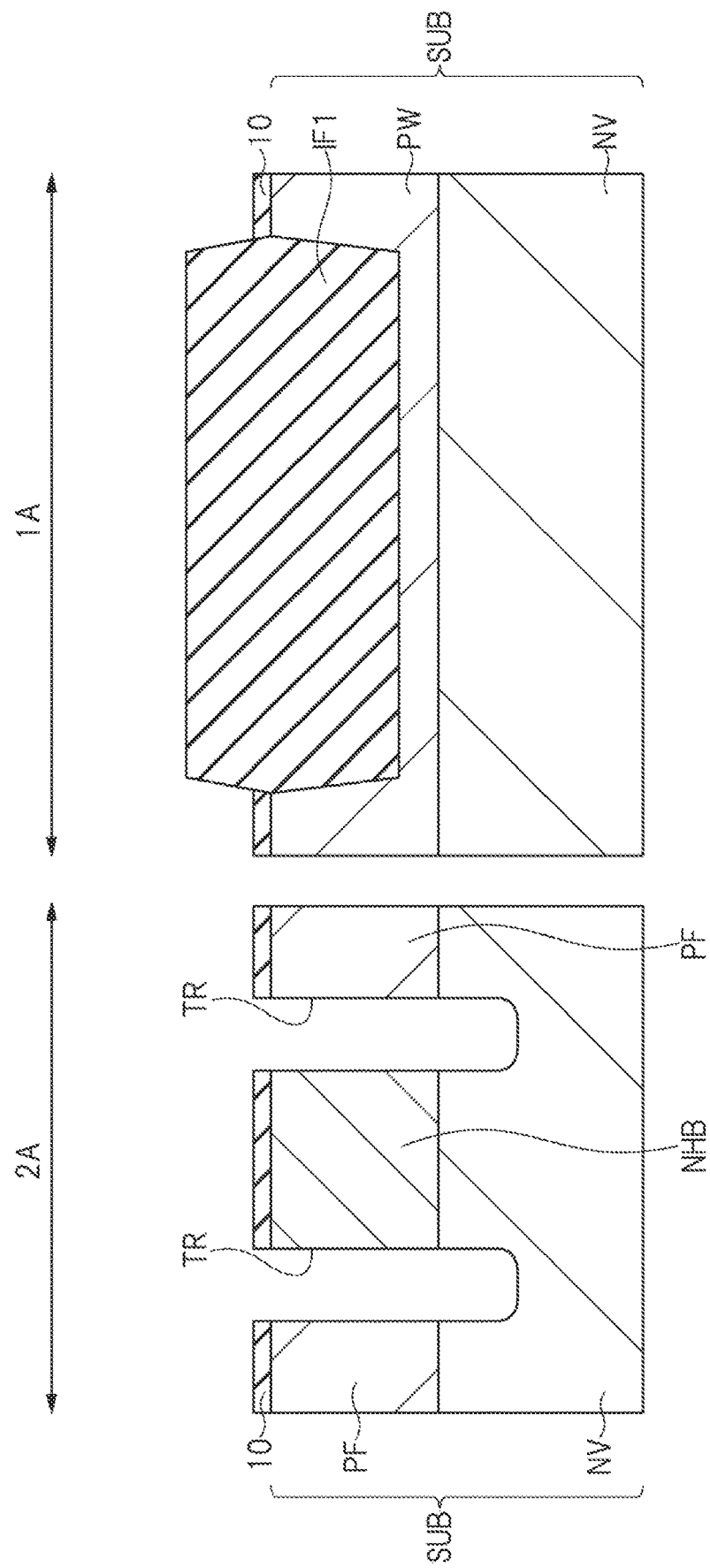
FIG. 13 is a cross-sectional view illustrating a manufacturing step following FIG. 12.

Next, as shown in FIG. 13, a trench TR is formed in SUB of the region 2A by a photolithography technique and a dry etching process.

Figure 14:
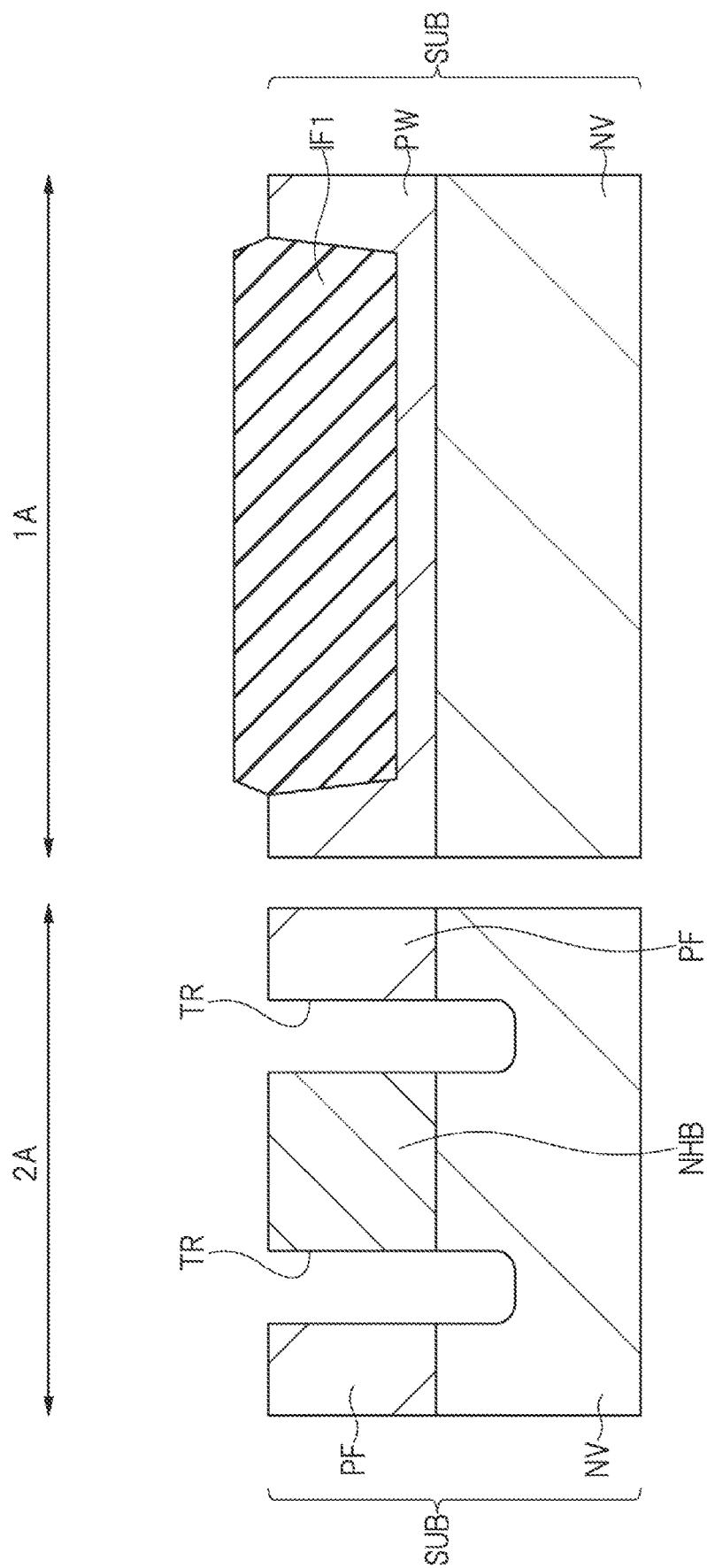
FIG. 14 is a cross-sectional view illustrating a manufacturing step following FIG. 13.

Next, as shown in FIG. 14, the silicon oxide film 10 is removed by an isotropic etching process using a solution containing hydrofluoric acid. At this time, since the insulating film IF1 is also exposed to the isotropic etching treatment, the upper surface of the insulating film IF1 is retreated, and the thickness of the insulating film IF1 is reduced.

Figure 15:
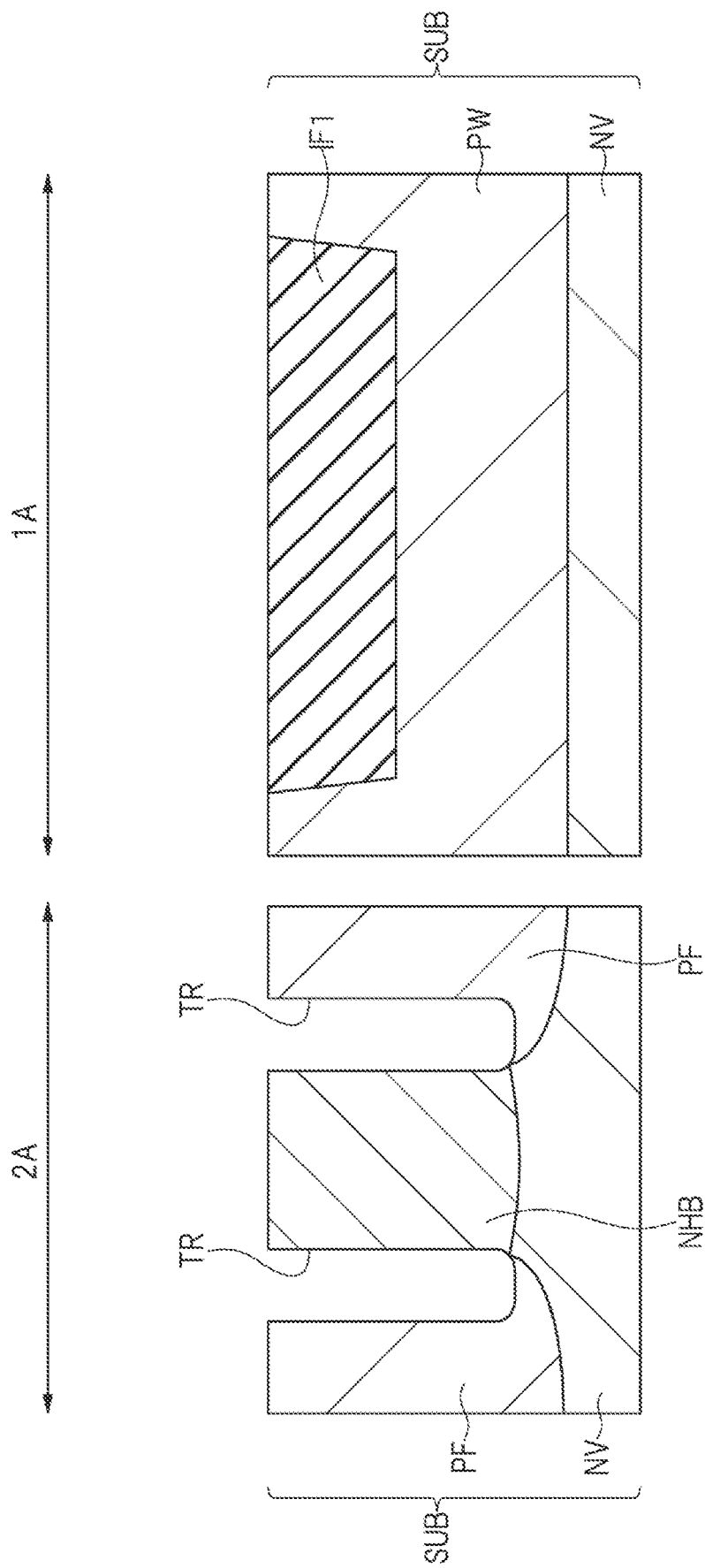
FIG. 15 is a cross-sectional view illustrating a manufacturing step following FIG. 14.

Next, as shown in FIG. 15, the semiconductor-substrate SUB is subjected to a heat treatment at, for example, 1000 to 1200° C. to diffuse impurities contained in the hole barrier region NHB, the floating region PF, and the well region PW. By this heat treatment, the hole barrier region NHB diffuses to the vicinity of the bottom of the trench TR, and the floating region PF diffuses to a position deeper than the bottom of the trench TR so as to cover the bottom of the trench TR.

Although not shown, this heat treatment is performed with a sacrificial silicon oxide film formed on the semiconductor-substrate SUB including the inside of the trench TR. After the heat treatment, the sacrificial silicon oxide film is removed by an isotropic etching process using a solution containing hydrofluoric acid. At this time, since the insulating film IF1 is also exposed to the isotropic etching treatment, the upper surface of the insulating film IF1 is retreated, and the thickness of the insulating film IF1 is reduced. In this condition, the thickness of the insulating film IF1 is, for example, 500~600 nm.

Figure 16:
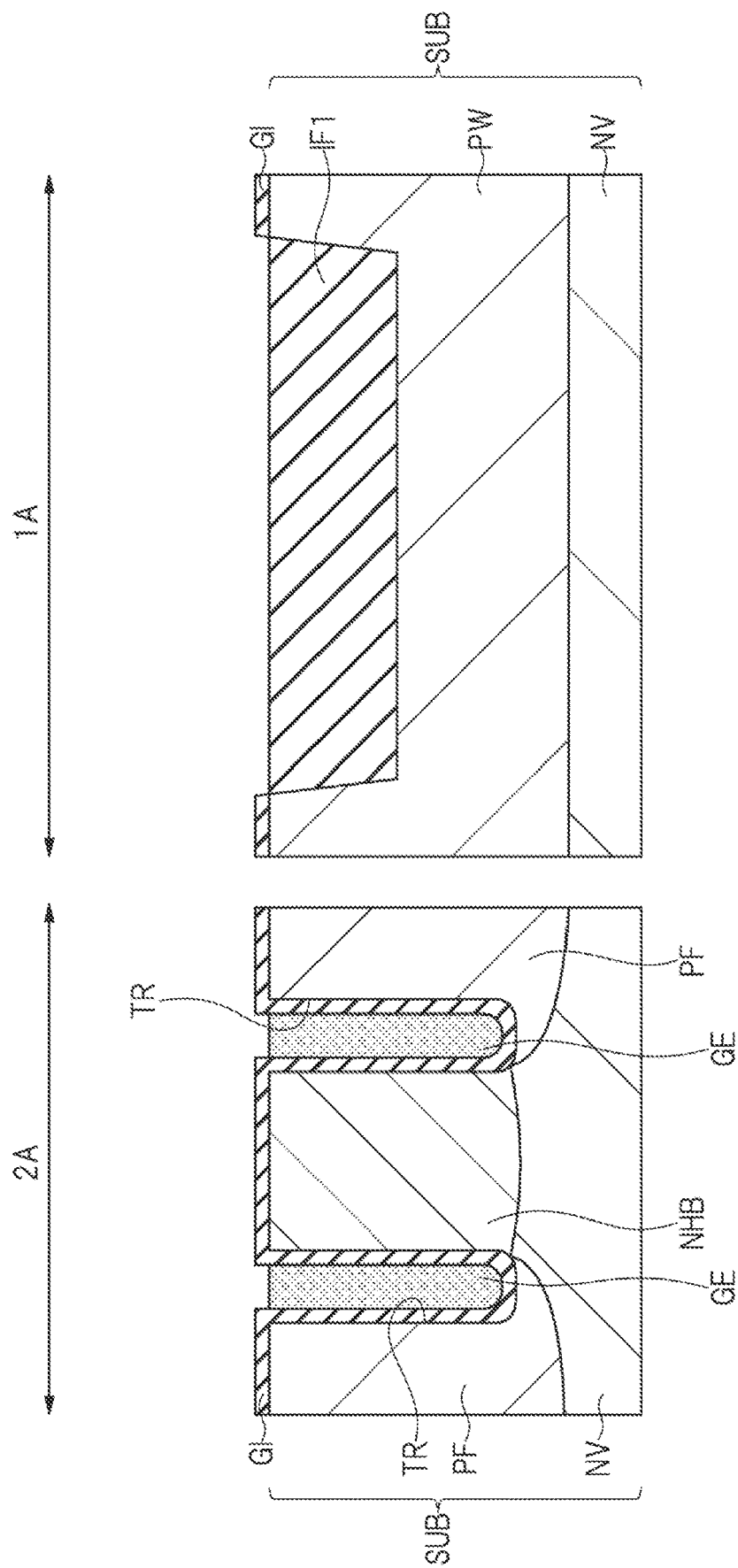
FIG. 16 is a cross-sectional view illustrating a manufacturing step following FIG. 15.

Next, as shown in FIG. 16, a gate-insulating film GI is formed inside the trench TR and on the semiconductor-substrate SUB. The gate-insulating film GI is formed by a thermal oxidation treatment. The thickness of the gate dielectric film GI is, for example, 100 nm.

Next, the gate-electrode GE is formed so as to fill the trench TR. In order to form the gate electrode GE, first, an n-type doped polycrystalline silicon film is formed on the gate insulating film GI by, for example, a CVD method. Next, the polycrystalline silicon film formed outside the trench TR is removed by dry-etching. A polysilicon film formed inside the trench TR is left as a gate-electrode GE.

Figure 17:
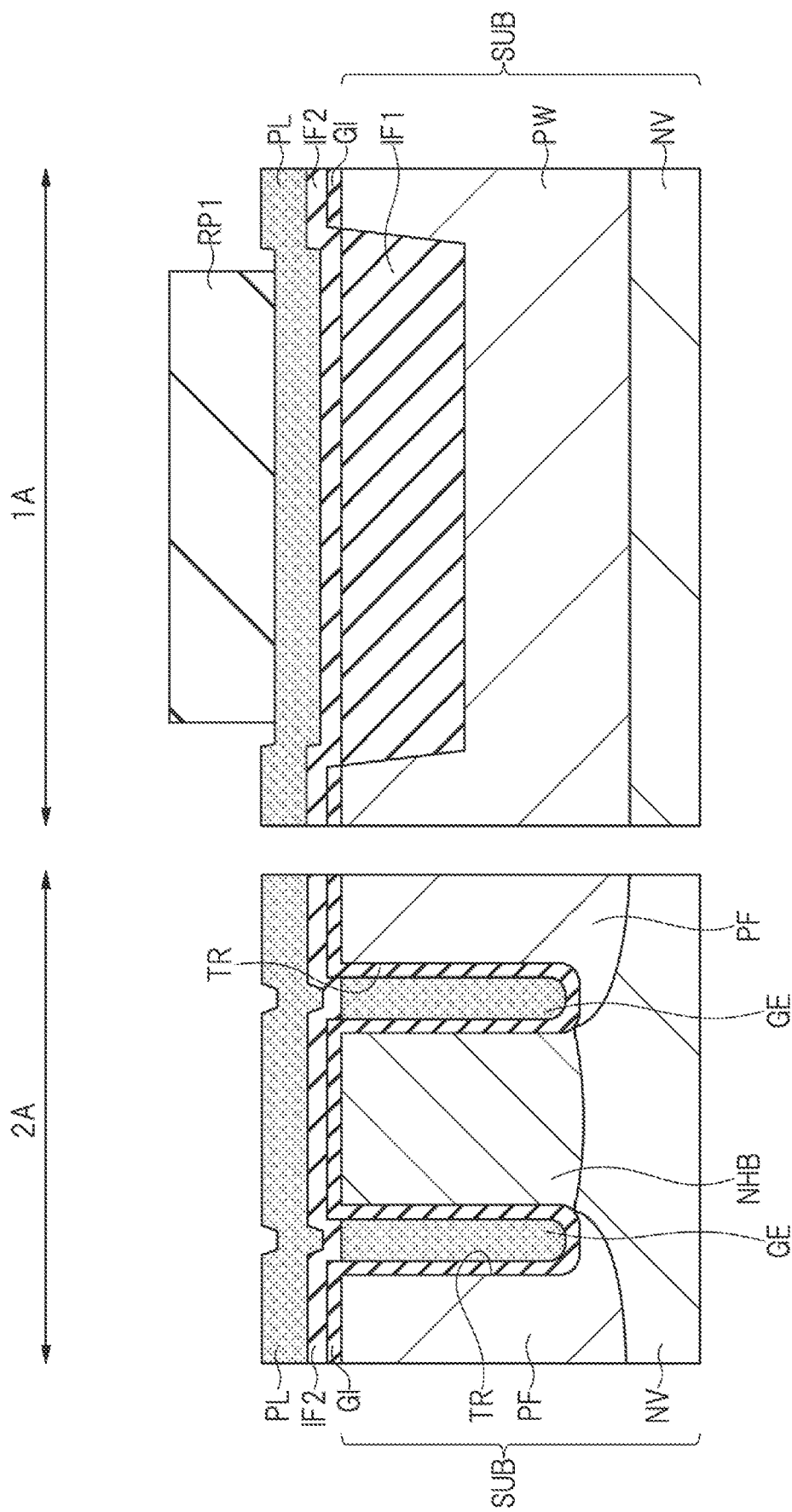
FIG. 17 is a cross-sectional view illustrating a manufacturing step following FIG. 16.

Next, as shown in FIG. 17, an insulating film IF2 is formed on the insulating film IF1, the gate electrode GE, and the gate insulating film GI formed outside the trench TR by, for example, a CVD method. The thickness of the insulating film IF2 is, for example, 50~100 nm. Next, a conductive film PL is formed on the insulating film IF2 by, for example, a CVD method. The thickness of the conductive film PL is, for example, 150~250 nm.

Next, a p-type impurity is introduced into the conductive film PL by ion-implantation. Note that n-type and p-type impurities are introduced into the conductive film PL on the region 3A by a photolithography technique and an ion-implantation method, and the anode region PLP and the cathode region PLN are formed. Next, a resist pattern RP1 is formed on the conductive film PL on the region 1A so as to selectively cover the conductive film PL located on the insulating film IF1. Note that the anode region PLP and the cathode region PLN are also covered with the resist pattern RP1.

Figure 18:
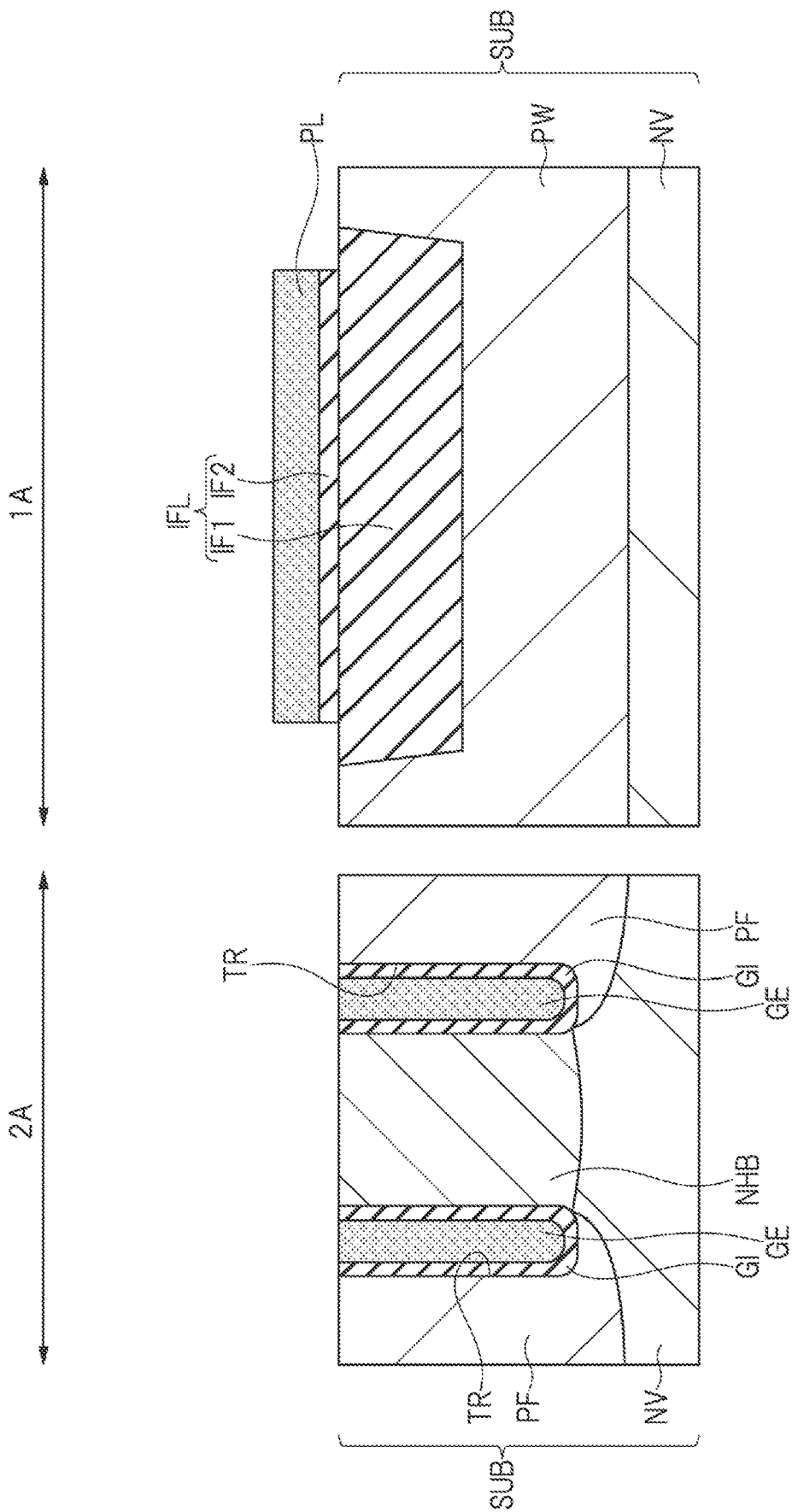
FIG. 18 is a cross-sectional view illustrating a manufacturing step following FIG. 17.

Next, as shown in FIG. 18, the conductive film PL and the insulating film IF2 are patterned by performing a dry etching process using the resist pattern RP1 as a mask. As a result, a resistive element is formed in the region 1A, and a diode element is formed in the region 3A. The patterned insulating film IF2 and the insulating film IF1 constitute the insulating layers IFL. In this dry-etching process, the gate insulating film GI formed outside the trench TR is also removed. Thereafter, the resist pattern RP1 is removed by ashing.

Figure 19:
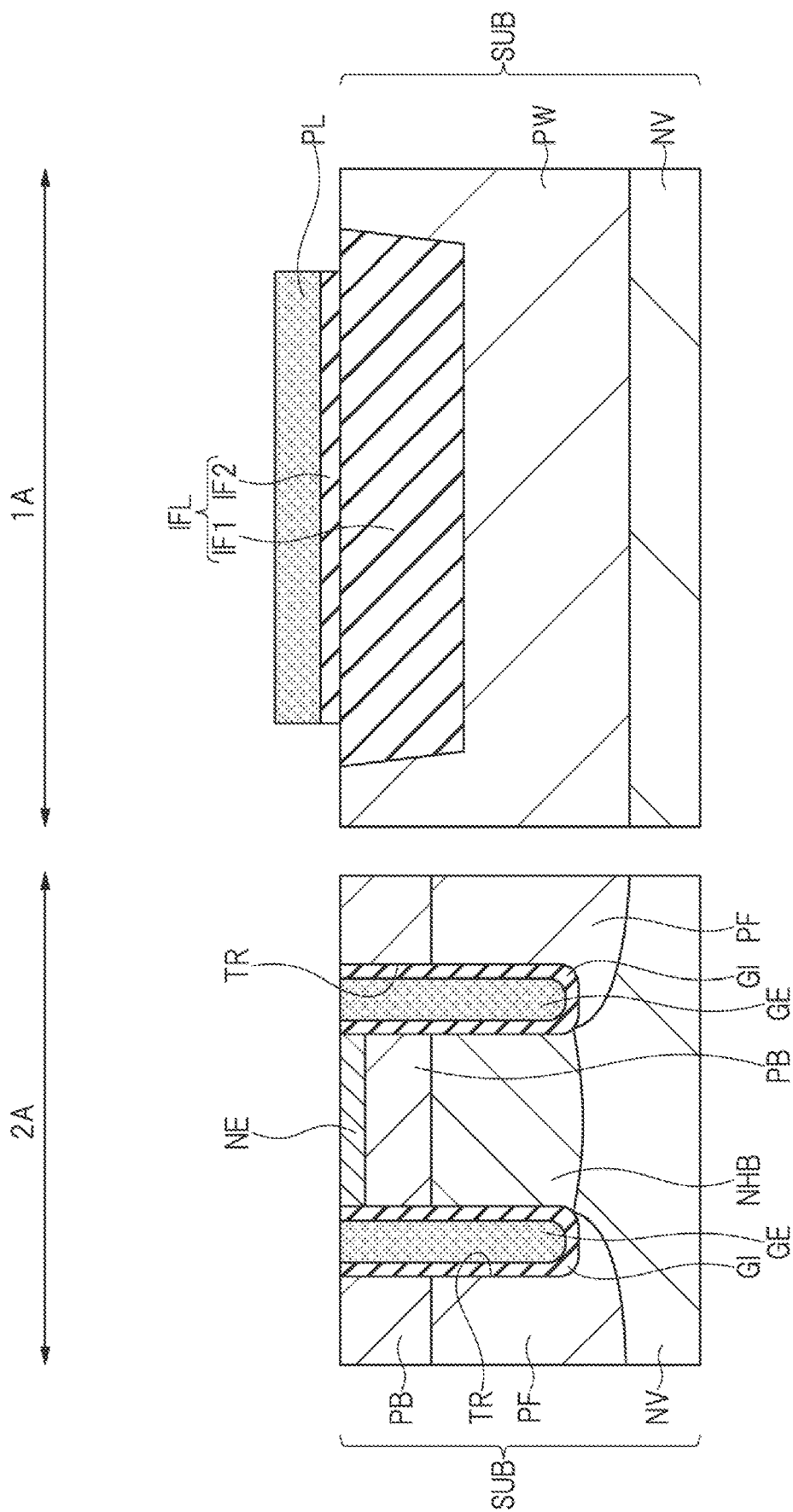
FIG. 19 is a cross-sectional view illustrating a manufacturing step following FIG. 18.

Next, as shown in FIG. 19, a p-type base region PB is formed on the semiconductor substrate SUB (the floating region PF and the hole barrier region NHB) by photolithography and ion implantation on the upper surface of the semiconductor substrate SUB. The bottom of the base-region PB is located above the bottom of the trench TR. Next, an n-type emitter region NE is formed in the base region PB by photolithography and ion-implantation. Thereafter, heat treatment is performed to activate impurities contained in the impurity regions.

Figure 20:
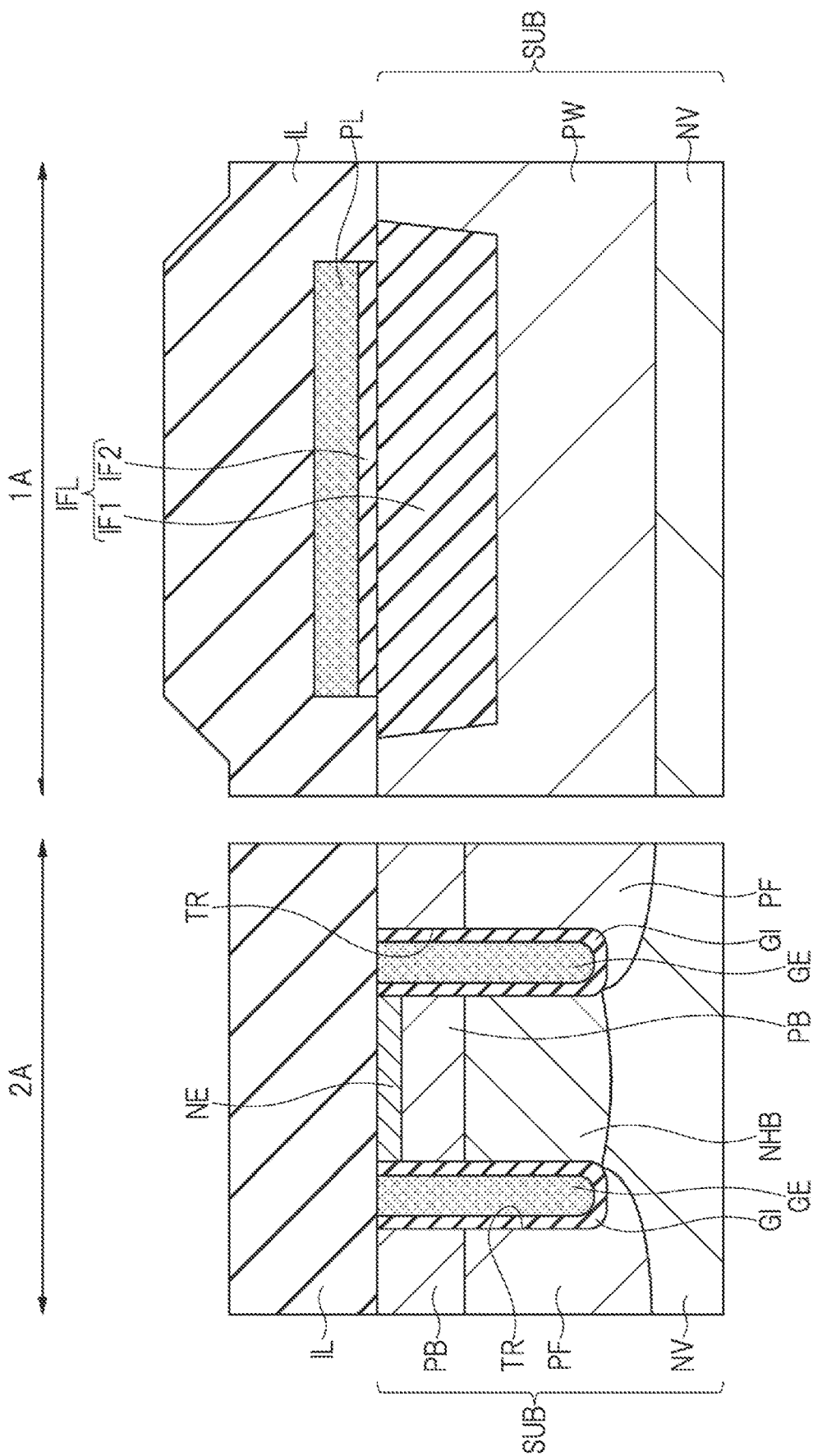
FIG. 20 is a cross-sectional view illustrating a manufacturing step following FIG. 19.

Next, as shown in FIG. 20, an interlayer insulating film IL is formed on the upper surfaces of the regions 1A and 2A of the semiconductor-substrate SUB so as to cover the conductive film PL, the gate-electrode GE, the base-region PB, and the emitter-region NE.

Figure 21:
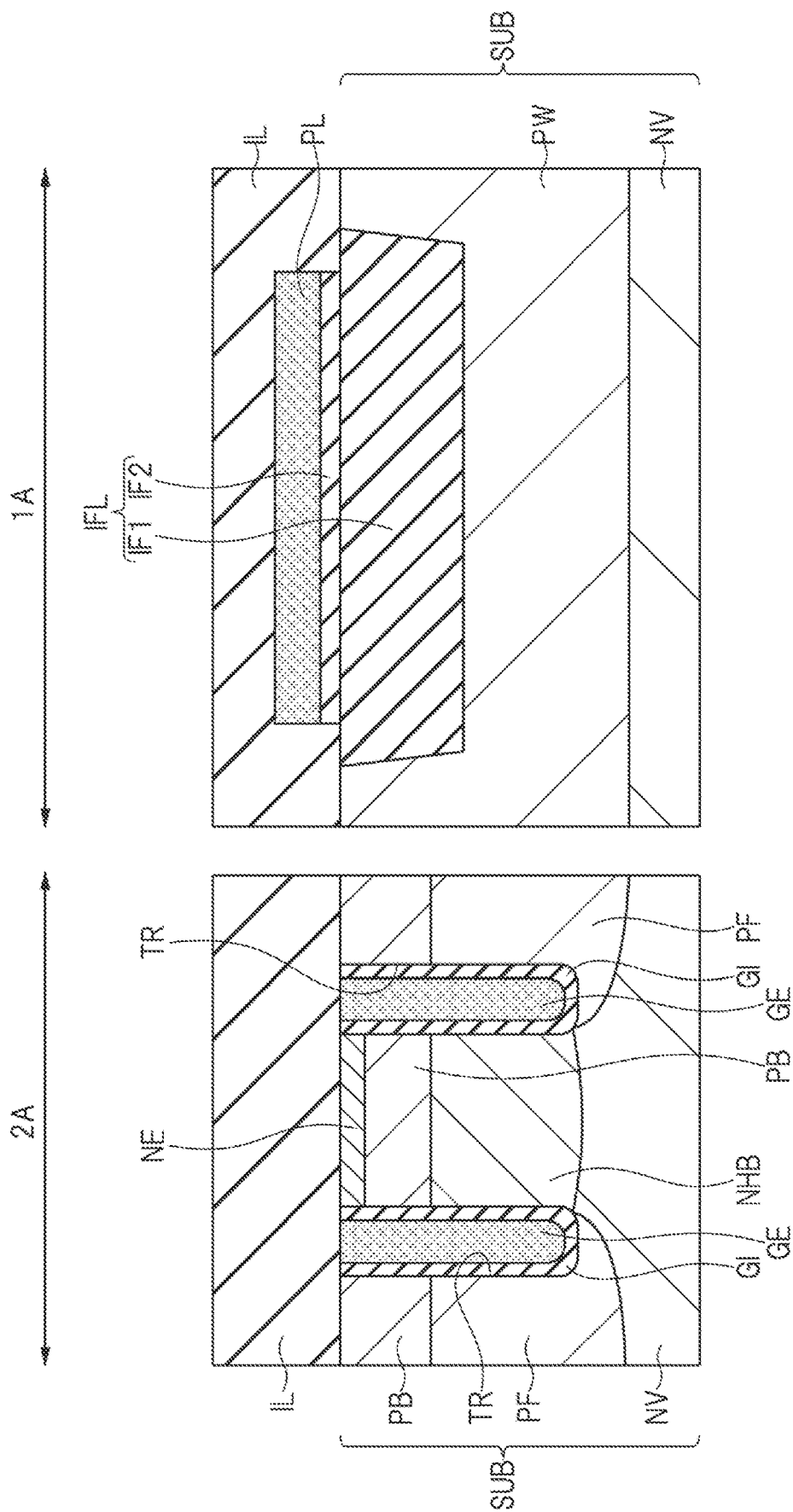
FIG. 21 is a cross-sectional view illustrating a manufacturing step following FIG. 20.

Next, as shown in FIG. 21, in order to planarize the upper surface of the interlayer insulating film IL, a planarization process is performed by CMP method on the interlayer insulating film IL of the regions 1A and 2A. After the planarization treatment, the thickness of the interlayer insulating film IL on the upper surface of the semiconductor substrate SUB is, for example, 600~800 nm, and the thickness of the interlayer insulating film IL on the upper surface of the conductive film PL is, for example, 300~450 nm.

Figure 22:
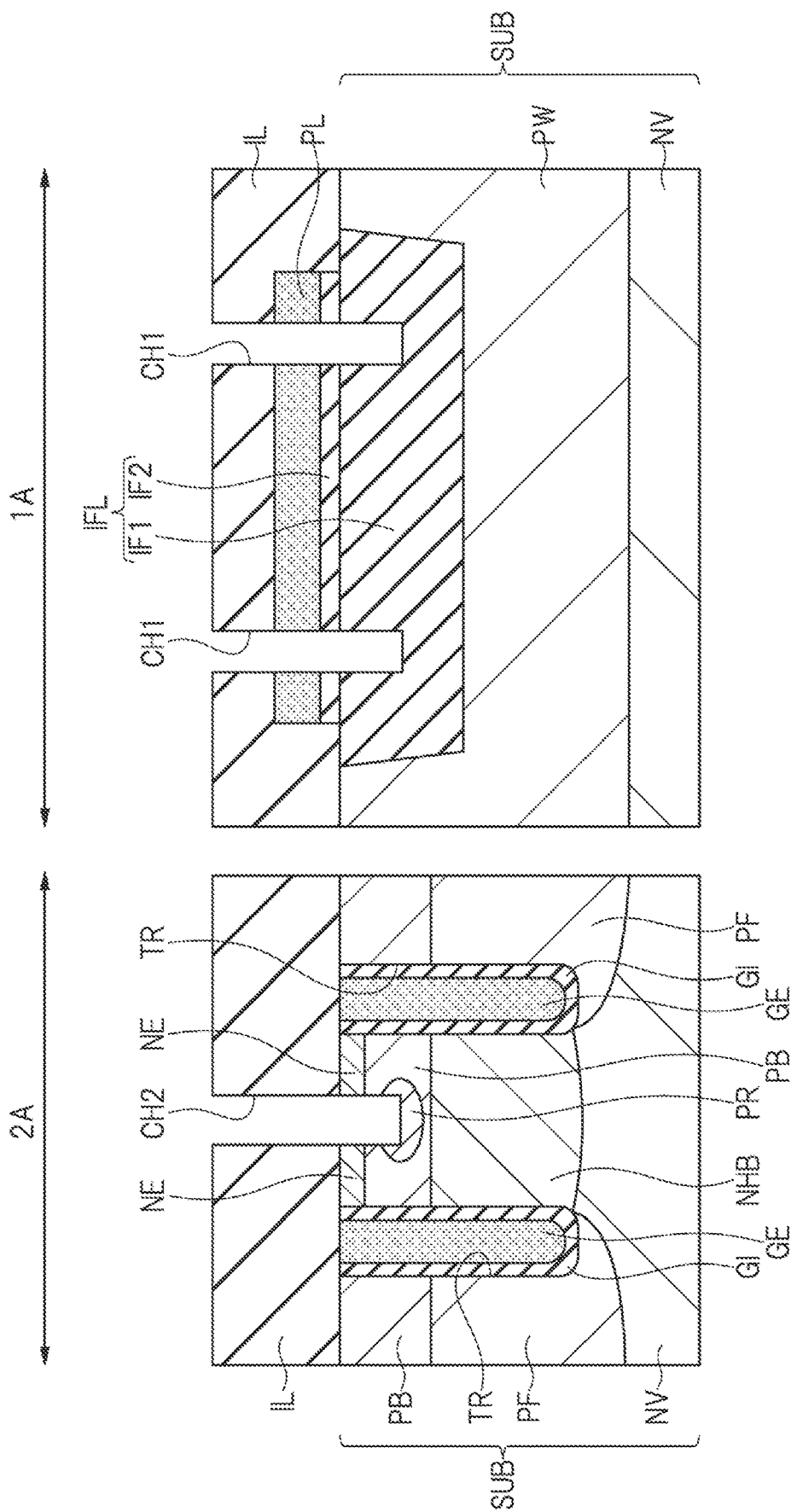
FIG. 22 is a cross-sectional view illustrating a manufacturing step following FIG. 21.

Next, as shown in FIG. 22, a contact hole CH1 is formed in the interlayer insulating film IL, the conductive film PL, the insulating film IF2, and the insulating film IF1 in the region 1A by a photolithography technique and a dry etching process. At the same time, in the region 2A, a contact hole CH2 is formed in the interlayer insulating film IL, the emitter region NE, and the base region PB. Next, a p-type high-concentration diffused region PR is formed on the base region PB located at the bottom of the contact hole CH2 by ion-implantation.

Figure 29:
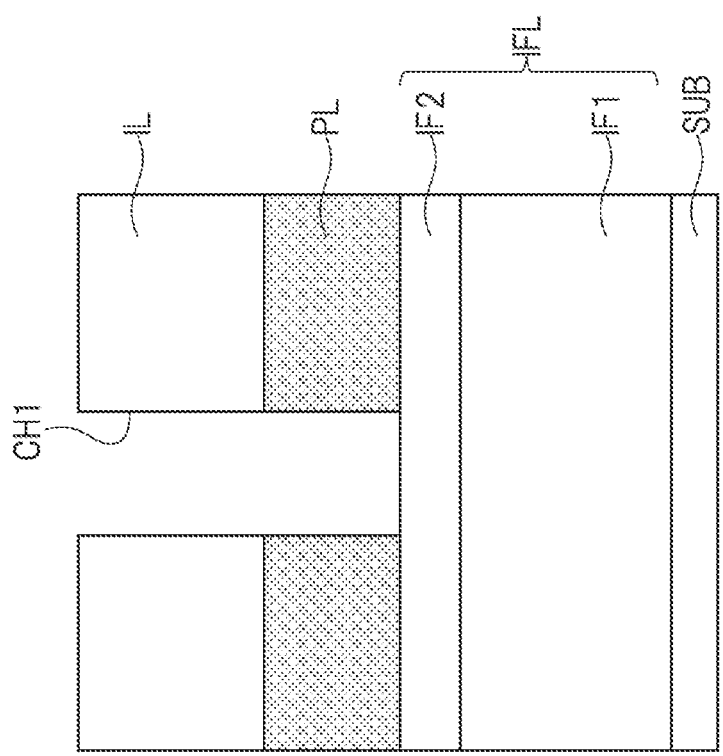
FIG. 29 is a cross-sectional view showing a semiconductor device according to a third study example.
Figure 30:
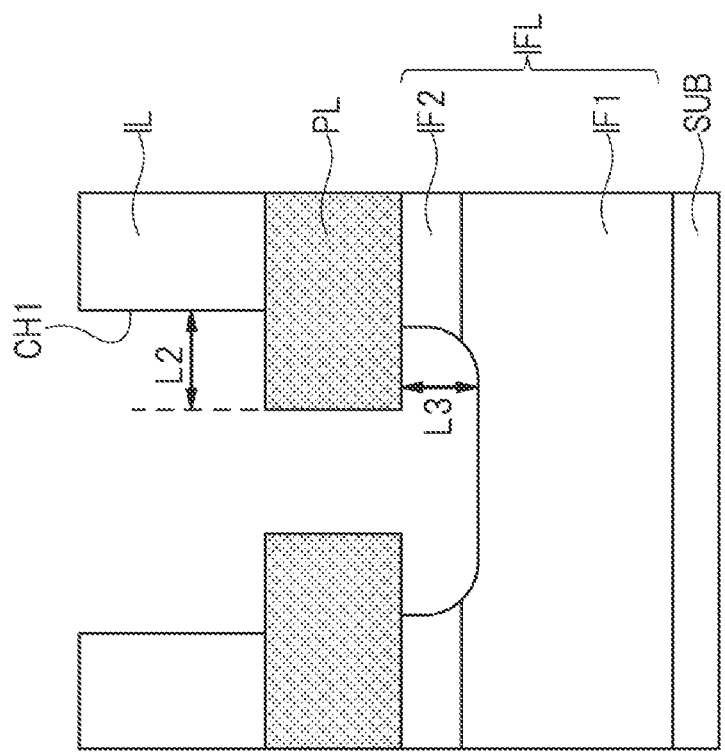
FIG. 30 is a cross-sectional view illustrating a manufacturing process following FIG. 29.
Figure 31:
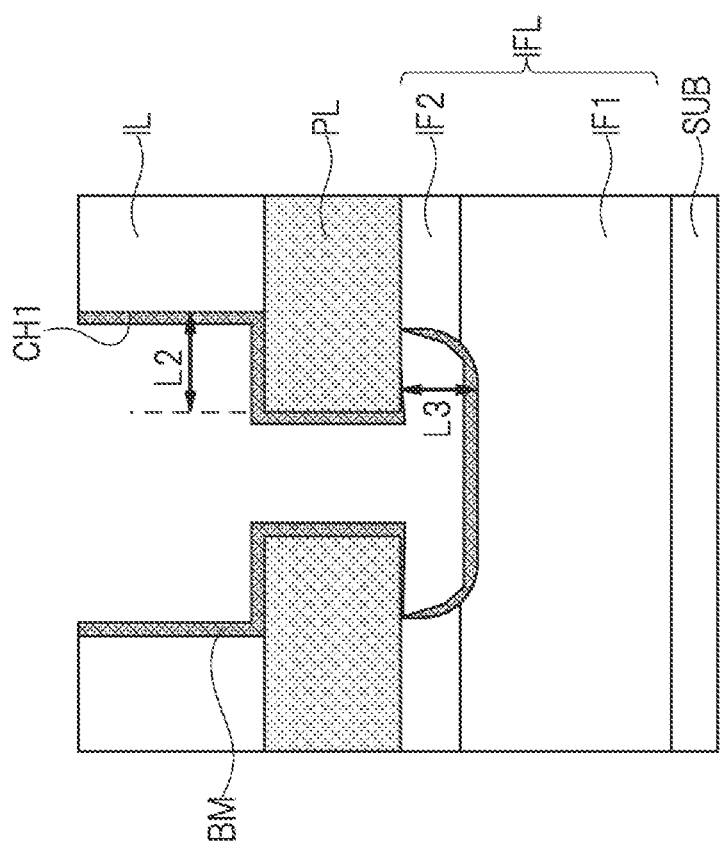
FIG. 31 is A cross-sectional view illustrating a manufacturing process following FIG. 30.
Figure 32:
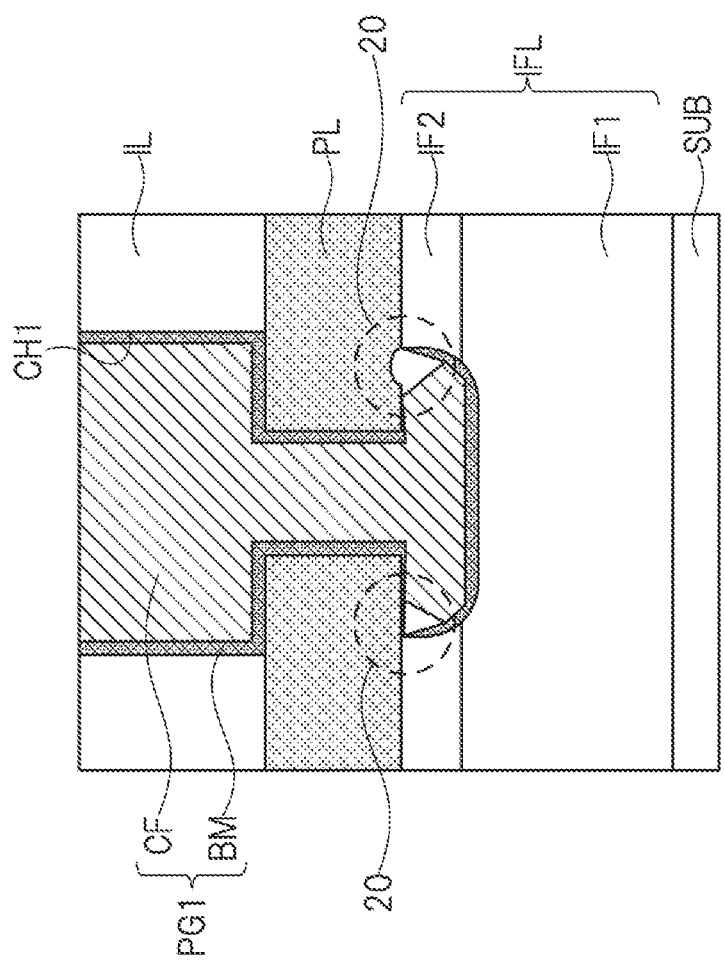
FIG. 32 is a cross-sectional view illustrating a manufacturing process following FIG. 31.

Here, the bottom of the contact hole CH1 is located in the insulating film IF1, and the bottom of the contact hole CH2 is located in the base-region PB. In Study 3, as shown in FIG. 29, the contact hole CH1 penetrated the conductive film PL, and the bottom portion of the contact hole CH1 was located on the insulating film IF2 or in the insulating film IF2. In the first embodiment, the contact hole CH1 is formed deeper than in the third embodiment.

At this point, the distance from the lower surface of the conductive film PL to the bottom portion of the contact hole CH1 is, for example, 100~150 nm. In other words, the amount of etching the insulating layer IFL in FIG. 22 is set to be larger than the amount of etching the interlayer insulating film IL and the insulating layer IFL by the isotropic etching process in FIG. 23.

Figure 23:
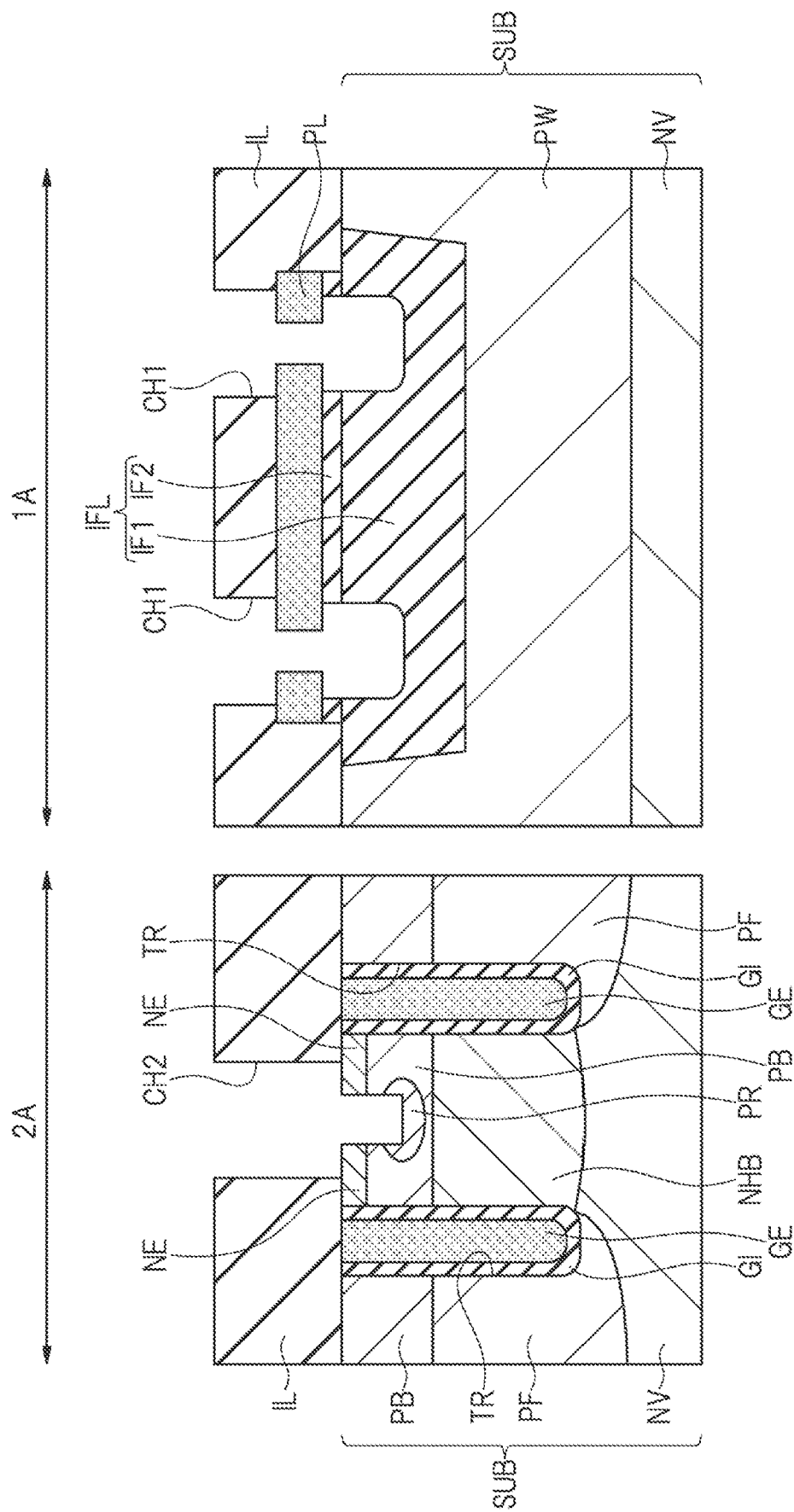
FIG. 23 is a cross-sectional view illustrating a manufacturing step following FIG. 22.

Next, as shown in FIG. 23, the interlayer insulating film IL and the insulating layer IFL (the insulating film IF2 and the insulating film IF1) are isotropically etched using solutions containing hydrofluoric acid. By the isotropic etching process, the side surface of the interlayer insulating film IL is separated from the side surface of the conductive film PL so that a part of the upper surface of the conductive film PL is exposed in the contact hole CH1. Further, in the contact hole CH1, the side surface (the side surface of the insulating film IF1 and the side surface of the insulating film IF2) of the insulating layer IFL is separated from the side surface of the conductive film FL so that a part of the lower surface of the conductive film PL is exposed. Further, in the contact hole CH2, the side surface of the interlayer insulating film IL is separated from the side surface of the emitter region NE so that a part of the upper surface of the emitter region NE is exposed.

Then, the depth of the contact hole CH1 is also increased by the isotropic etching process described above. That is, as shown in FIG. 7, the distance L1 from the lower surface of the conductive film PL to the bottom portion of the contact hole CH1 is longer than the distance L2.

Figure 24:
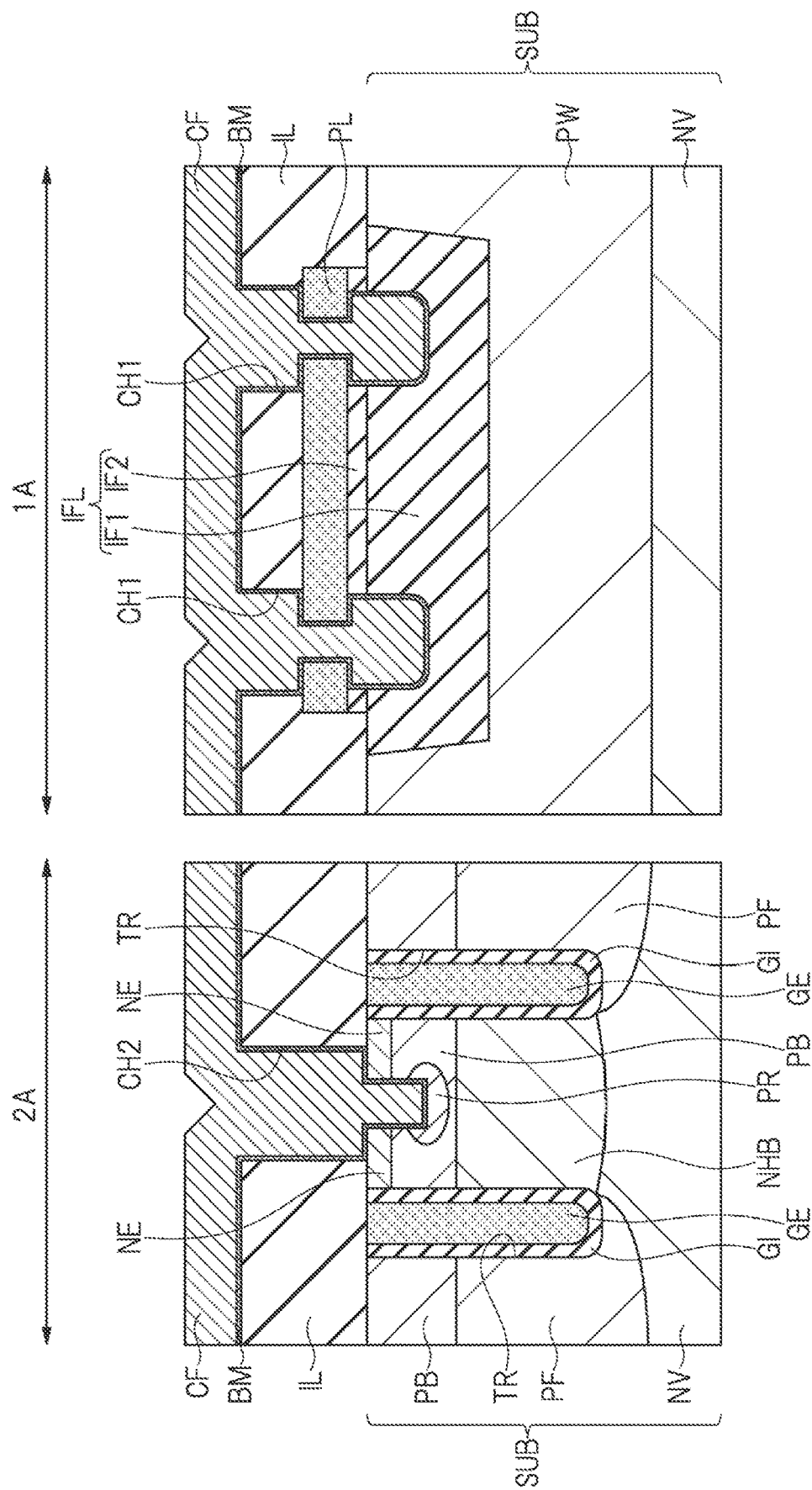
FIG. 24 is a cross-sectional view illustrating a manufacturing step following FIG. 23.

Next, as shown in FIG. 24, a barrier metal film BM is formed on the interlayer insulating film IL including the inside of the contact hole CH1 and the inside of the contact hole CH2 by CVD method. The barrier metal film BM is, for example, a laminated film of a titanium film and a titanium nitride film. At this point, the barrier metal film BM is in contact with a part of the upper surface of the conductive film PL, a side surface of the conductive film PL, and a part of the lower surface of the conductive film PL in the contact hole CH1.

Next, a conductive film CF is formed on the barrier metal film BM so as to fill the inside of the contact hole CH1 and the inside of the contact hole CH2. The conductive film CF is, for example, a tungsten film, and is formed using $WF_6$ gases.

Figure 25:
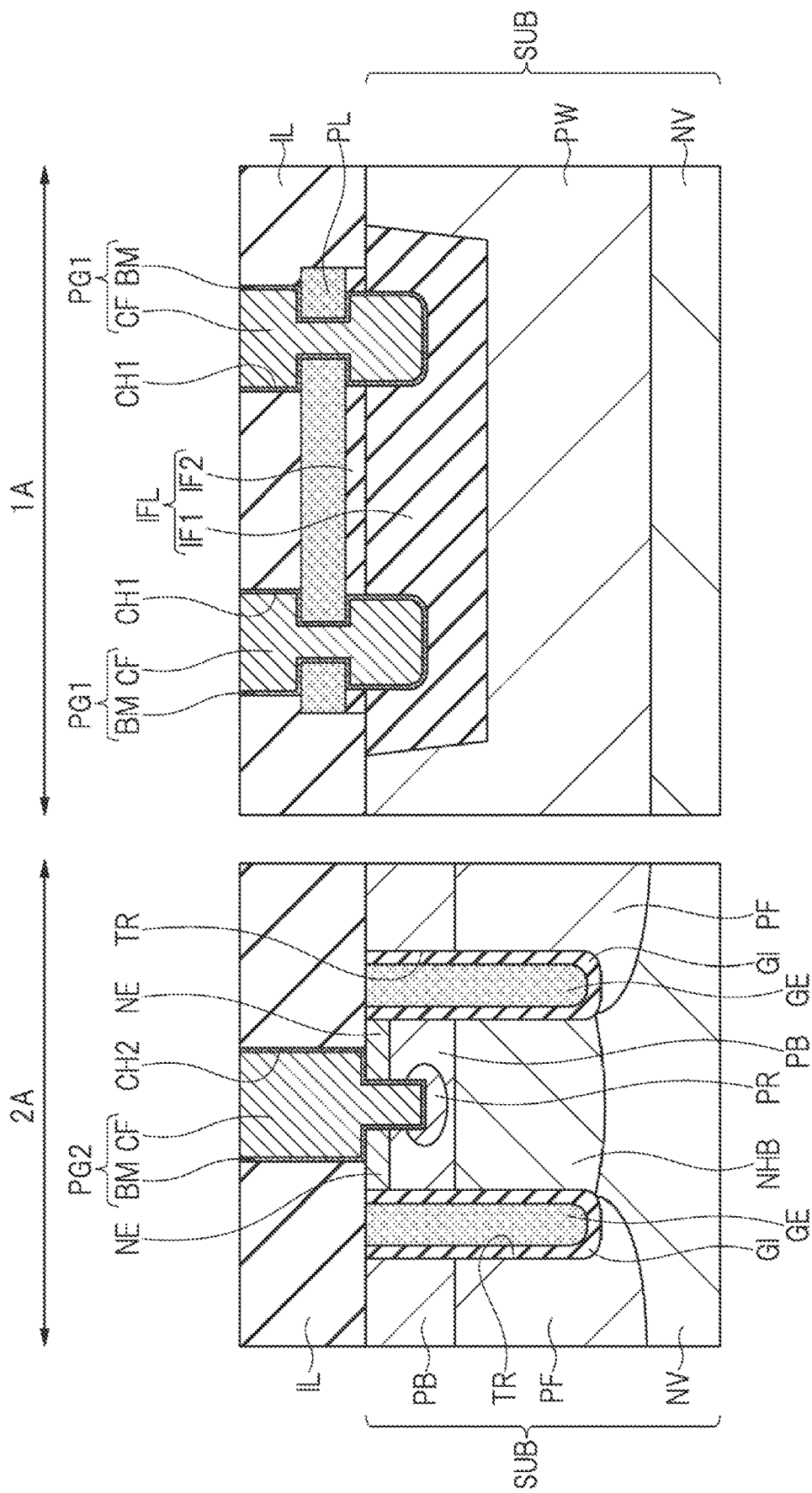
FIG. 25 is a cross-sectional view illustrating a manufacturing step following FIG. 24.

Next, as shown in FIG. 25, the conductive film PL and the barrier metal film BM formed outside the contact hole CH1 and outside the contact hole CH2 are removed by a polishing treatment or an anisotropic dry etching treatment using a CMP method. As a result, in the contact hole CH1, the conductive film PL and the barrier metal film BM are embedded in the plug PG1, and the conductive film PL and the barrier metal film BM are embedded in the contact hole CH2 in the plug PG2.

Figure 26:
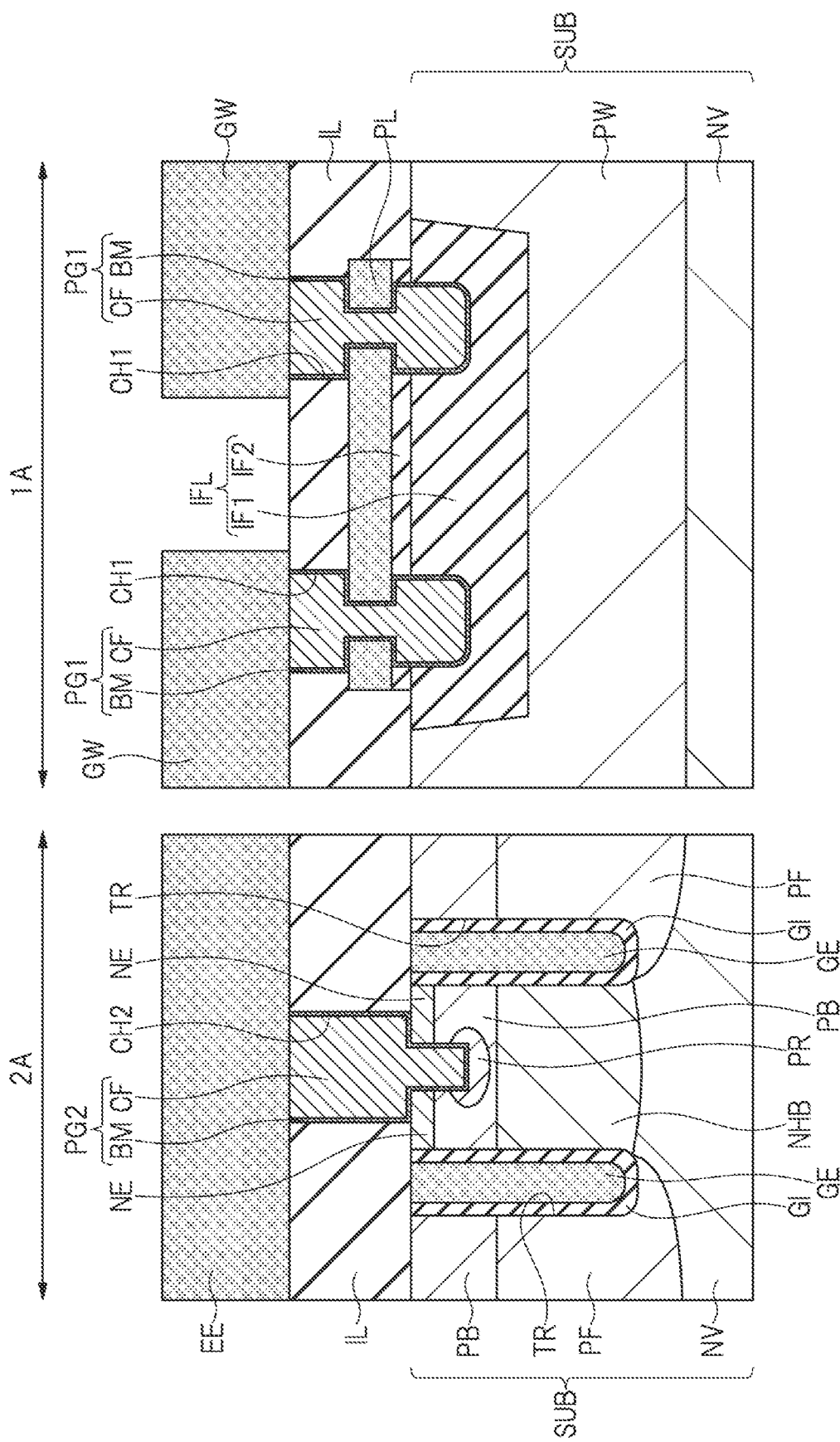
FIG. 26 is a cross-sectional view illustrating a manufacturing step following FIG. 25.
Figure 27:
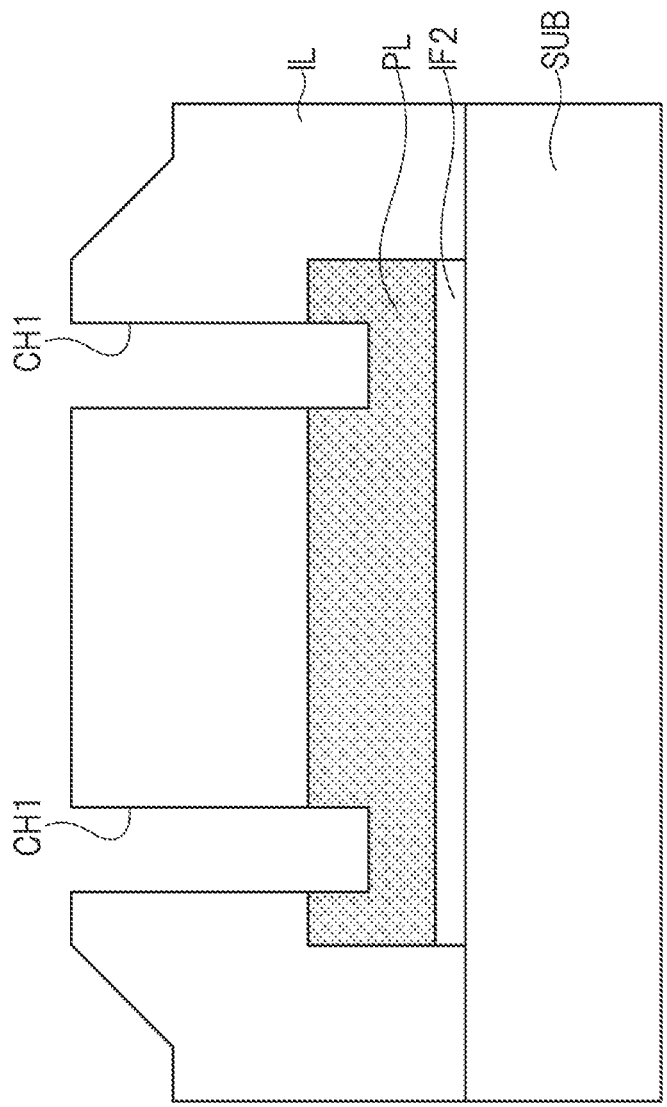
FIG. 27 is a cross-sectional view showing a semiconductor device according to a first study example.
Figure 28:
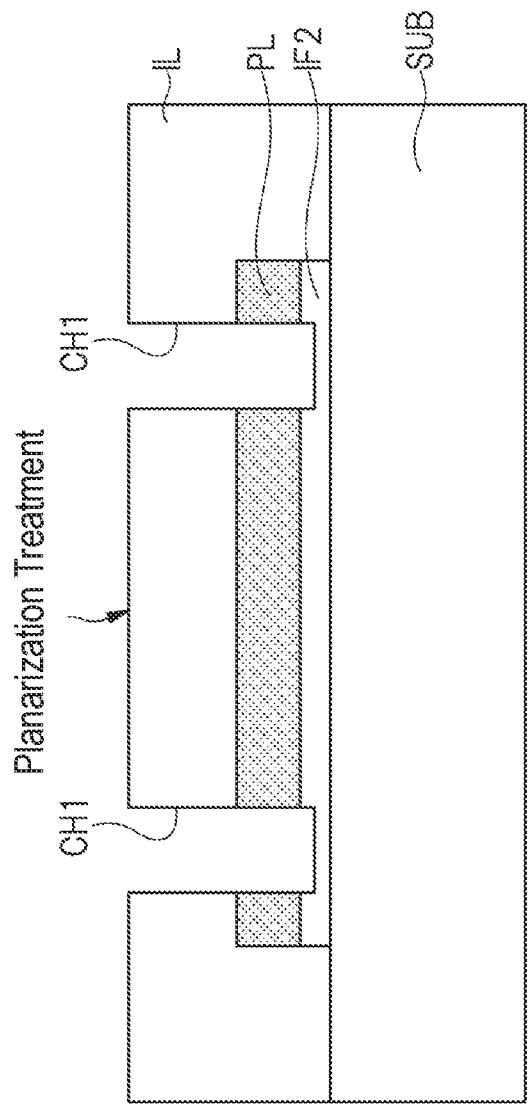
FIG. 28 is a cross-sectional view showing a semiconductor device according to a second study example.

Next, as shown in FIG. 26, a gate wire GW is formed on the interlayer insulating film IL of the region LA, and an emitter-electrode EE is formed on the interlayer insulating film IL of the region 2A. First, a TiW film is formed on the interlayer insulating film IL by, e.g., sputtering, and an aluminium film is formed on TiW film by, e.g., sputtering. Next, TiW film and the aluminium film are patterned by a photolithography technique and a dry etching process to form a gate-wiring GW and an emitter-electrode EE.

Thereafter, the field stop region NS, the collector region PC, and the collector electrode CE are formed on the lower surface of the semiconductor-substrate SUB, thereby obtaining the structure of FIG. 5.

First, a support tape is attached to the upper surface of the semiconductor substrate SUB, and the lower surface of the semiconductor substrate SUB is ground to reduce the thickness of the semiconductor substrate SUB to, for example, 80 to 90 micrometers. Then, the ground damage layers are removed by etching the lower surface of SUB with hydrofluoric acid. Thereafter, the n-type field stop region NS and the p-type collector region PC are formed by ion-implantation from the lower surface of the semiconductor-substrate SUB. After these implantation, laser annealing is performed to activate the impurities contained in the field stop region NS and the collector region PC. Next, on the lower surface of the semiconductor substrate SUB, under the lower surface of the semiconductor substrate SUB, for example, by a sputtering method, to form a AlSi film, a Ti film, a metal film such as a NiV film and a Au film. The metallic film serves as a collector-electrode CE.

As described above, the semiconductor device 100 according to the first embodiment is manufactured.

The manufacturing method of the first embodiment, similarly to Examination Example 2, it is possible to correspond to the device in which the miniaturization is advanced than Examination Example 1. For example, in order to improve the processing accuracy of the contact hole, the level difference of the upper surface of the interlayer insulating film IL is reduced. For this purpose, a planarization process is performed on the upper surface of the interlayer insulating film IL by CMP method to reduce the thickness of the conductive film PL. In addition, by reducing the thickness of the insulating film IF1 so that the upper surface of the insulating film IF1 is substantially flush with the upper surface of the semiconductor-substrate SUB, the step of the upper surface of the interlayer insulating film IL is reduced.

Even in this case, by forming the insulating layer PL below the conductive film IFL, it is possible to eliminate the problem that the contact hole CH1 penetrates through the conductive film SUB and reaches the semiconductor-substrate OOE. Further, in order to avoid such a defect, since the contact hole CH1 does not require to be formed in a manufacturing process different from the contact hole CH2, there is no need to increase the number of masks and add a manufacturing process, and an increase in manufacturing costs can be suppressed.

In addition, after the contact hole CH1 is formed deeper in the process of FIG. 22 than in the third study, the contact hole CH1 is further deepened by the isotropic etch process of FIG. 23. That is, L1 from the lower surface of the conductive film PL to the bottom portion of the contact hole CH1 is sufficiently long. Accordingly, since the barrier metal film BM is normally formed, the conductive film CF is easily grown sufficiently using the barrier metal film BM as a seed film. In addition, since there is no portion where the barrier metal film BM is very thin, or a portion where the barrier metal film BM is not formed, $WF_6$ gases react with the conductive film CF, and a part of the conductive film CF is lacking. Therefore, a highly reliable semiconductor device 100 can be manufactured.

Although the present invention has been described based on the above embodiments, the present invention is not limited to the above embodiments, and can be variously modified without departing from the gist thereof.

For example, in the above-described embodiment, IGBT is exemplified as a device formed in the region 2A, but the technique disclosed in the above-described embodiment is not limited to IGBT, and can be applied to a power MOSFET having a vertical trench gate structure.

What is claimed is:

1. A method of manufacturing a semiconductor device comprising the steps of:
  (a) preparing a semiconductor substrate having an upper surface and a lower surface;
  (b) after the step (a), forming a first insulating film extending from an upper surface of the semiconductor substrate to an inside of the semiconductor substrate;
  (c) after the step (b), forming a second insulating film having a thickness thinner than the first insulating film on the first insulating film;
  (d) after the step (c), forming a first conductive film on the second insulating film;
  (e) after the step (d), forming an interlayer insulating film on the upper surface of the semiconductor substrate so as to cover the first conductive film;
  (f) after the step (e), forming a first contact hole in the interlayer insulating film, the first conductive film, the second insulating film and the first insulating film so that a bottom portion of the first contact hole is located in the first insulating film,
  (g) after the step (f), subjecting the interlayer insulating film, the second insulating film and the first insulating film to an isotropic etching treatment, and
  (h) after the step (g), embedding a first plug in the first contact hole,
  wherein a side surface of the interlayer insulating film is separated from a side surface of the first conductive film so that a part of an upper surface of the first conductive film is exposed from the interlayer insulating film in the first contact hole by the isotropic etching treatment in the step (g),
  wherein a side surface of the first insulating film and a side surface of the second insulating film in the first contact hole are separated from the side surface of the first conductive film so that a part of a lower surface of the first conductive film is exposed from the first and second insulating films by the isotropic etching treatment in the step (g), and
  wherein a first distance from the lower surface of the first conductive film to the bottom portion of the first contact hole is longer than a second distance from the side surface of the first conductive film to the side surface of the interlayer insulating film.

2. A method of manufacturing a semiconductor device according to claim 1, wherein the first plug includes a barrier metal film and a second conductive film,
  wherein the step (h) includes:
  (h1) forming the barrier metal film in the first contact hole by CVD method; and
  (h2) forming the first conductive film on the barrier metal film so as to fill the first contact hole, and
  wherein the barrier metal film is in contact with a portion of the upper surface, the side surface and a portion of a lower surface of the first conductive film in the first contact hole.

3. A method of manufacturing a semiconductor device according to claim 1, wherein the first insulating film is a silicon oxide film formed by a thermal oxidation method, the second insulating film is a silicon oxide film formed by a CVD method, and the first conductive film is a polycrystalline silicon film formed by a CVD method.

4. A method of manufacturing a semiconductor device according to claim 3, wherein the first insulating film is formed to a position higher than the upper surface of the semiconductor substrate in the step (b),
  wherein an isotropic etching process is performed on the first insulating film so that a thickness of the first insulating film is reduced between the step (b) and the step (c).

5. A method of manufacturing the semiconductor device according to claim 1, further comprising the step of forming an IGBT cell in a region different from a region in which the first conductive film is formed,
  wherein the step of forming the IGBT cell includes:
  (i) forming a trench in the upper side of the semiconductor substrate, after the step (b) and before the step (c);
  (j) forming a gate insulating film in the trench, after the step (i) and before the step (c);
  (k) forming a gate electrode on the gate insulating film to fill up the trench, after the step (j) and before the step (c);
  (l) forming a base region of a first conductivity type on the upper surface of the semiconductor substrate so that a bottom portion of the base region is located above a bottom portion of the trench, after the step (d) and before the step (e), and (m) forming an emitter region of a second conductivity type opposite to the first conductivity type in the base region, after the step (l) and before the step (e), wherein a portion of the interlayer insulating film is formed to cover the gate electrode, the base region and the emitter region in the step (e), wherein a second contact hole is formed in the portion of the interlayer insulating film so that a bottom portion thereof is located in the base region in the step (f), wherein a side surface of the portion of the interlayer insulating film is separated from a side surface of the emitter region so that a part of an upper surface of the emitter region is exposed from the portion of the interlayer insulating film by the step (g), and wherein a second plug is embedded in the second contact hole in the step (h).

6. A method of manufacturing a semiconductor device according to claim 5, further comprising the steps of:

(n) performing a planarizing process on the interlayer insulating film by a CMP method in order to planarize an upper surface of the interlayer insulating film, after the step (e) and before the step (f).

7. A method of manufacturing a semiconductor device according to claim 5, further comprising the step of:

(o) forming a gate wiring electrically connected to the gate electrode on the interlayer insulating film and forming an emitter electrode on the interlayer insulating film region, after the step (h), wherein the base region and the emitter region are electrically connected to the emitter electrode via the second plug, and wherein the first conductive film is electrically connected to the gate wiring via the first plug and is used as one of a resistive element or a diode element.

* * * * *